(12) United States Patent
Chen

(10) Patent No.: US 11,699,752 B2
(45) Date of Patent: Jul. 11, 2023

(54) LATERALLY DIFFUSED MOSFET AND METHOD OF FABRICATING THE SAME

(71) Applicants: TAIWAN SEMICONDUCTOR MANUFACTURING COMPANY, LTD., Hsinchu (TW); TSMC CHINA COMPANY, LIMITED, Songjiang (CN)

(72) Inventor: Zheng Long Chen, Hsinchu (TW)

(73) Assignees: TAIWAN SEMICONDUCTOR MANUFACTURING COMPANY, LTD., Hsinchu (TW); TSMC CHINA COMPANY, LIMITED, Songjiang (CN)

( * ) Notice: Subject to any disclaimer, the term of this patent is extended or adjusted under 35 U.S.C. 154(b) by 35 days.

(21) Appl. No.: 17/165,165

(22) Filed: Feb. 2, 2021

(65) Prior Publication Data

US 2022/0115534 A1    Apr. 14, 2022

(30) Foreign Application Priority Data

Oct. 12, 2020  (CN) .......................... 202011083543.6

(51) Int. Cl.
*H01L 29/78* (2006.01)
*H01L 29/06* (2006.01)
(Continued)

(52) U.S. Cl.
CPC ...... *H01L 29/7816* (2013.01); *H01L 29/0653* (2013.01); *H01L 29/66681* (2013.01)

(58) Field of Classification Search
CPC .......... H01L 29/7816; H01L 29/66681; H01L 29/66659; H01L 29/7835; H01L 29/66674;
(Continued)

(56) References Cited

U.S. PATENT DOCUMENTS 6,900,101 B2 *  5/2005  Lin ................... H01L 29/66689
                                          257/E21.345
7,420,247 B2    9/2008  Xu et al.
(Continued)

FOREIGN PATENT DOCUMENTS

CN       108962996      12/2018
TW       201535734       9/2015

OTHER PUBLICATIONS

Office Action dated Jul. 20, 2022 for corresponding case No. TW 11120716320. (pp. 1-5).

*Primary Examiner* — Sonya McCall-Shepard
(74) *Attorney, Agent, or Firm* — Hauptman Ham, LLP

(57) ABSTRACT

A semiconductor device includes a first semiconductor region having a first conductivity type and a second semiconductor region having a second conductivity type, a source region and a body contact region in the second semiconductor region. The semiconductor device also includes a channel region, in the second semiconductor region, located laterally between the source region and the first semiconductor region, a gate dielectric layer overlying both the channel region and a portion of the first semiconductor region, and a gate electrode overlying the gate dielectric layer. The semiconductor device further includes a conformal conductive layer covering an upper surface of the body contact region and a side surface of the source region.

20 Claims, 37 Drawing Sheets

(51) Int. Cl.
*H01L 29/66* (2006.01)
*H01L 29/417* (2006.01)

(58) Field of Classification Search
CPC ........... H01L 29/66696; H01L 29/7801; H01L 29/78624; H01L 29/0843–0891; H01L 29/66636–66643; H01L 21/823418–823425; H01L 21/823814; H01L 29/0856–0869; H01L 29/0873–0886; H01L 29/7833–7836; H01L 29/41725–41766; H01L 29/665–66507; H01L 29/7845; H01L 29/66689; H01L 29/41783; H01L 29/41766; H01L 29/0684; H01L 29/0653
See application file for complete search history.

(56) References Cited

U.S. PATENT DOCUMENTS

| | | | |
|---|---|---|---|
| 7,589,378 B2 | 9/2009 | Kocon et al. | |
| 7,952,145 B2 | 5/2011 | Korec et al. | |
| 8,546,978 B2 | 10/2013 | Sato | |
| 10,090,409 B2 | 10/2018 | Mcgregor et al. | |
| 10,629,723 B2* | 4/2020 | Lin | H01L 29/7806 |
| 2008/0023785 A1* | 1/2008 | Hebert | H01L 21/26513 |
| | | | 257/E21.336 |
| 2013/0043534 A1* | 2/2013 | Disney | H01L 29/7816 |
| | | | 438/290 |
| 2014/0284701 A1* | 9/2014 | Korec | H01L 29/66659 |
| | | | 438/155 |
| 2019/0115468 A1* | 4/2019 | Huang | H01L 29/0869 |

* cited by examiner

LATERALLY DIFFUSED MOSFET AND METHOD OF FABRICATING THE SAME

BACKGROUND

LDMOS (laterally-diffused metal-oxide semiconductor) is a planar double-diffused MOSFET (metal-oxide-semiconductor field-effect transistor) used in amplifiers, including microwave power amplifiers, RF power amplifiers and audio power amplifiers. Various techniques are developed to improve the performance of the LDMOS devices or to improve the fabrication process for making the LDMOS devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
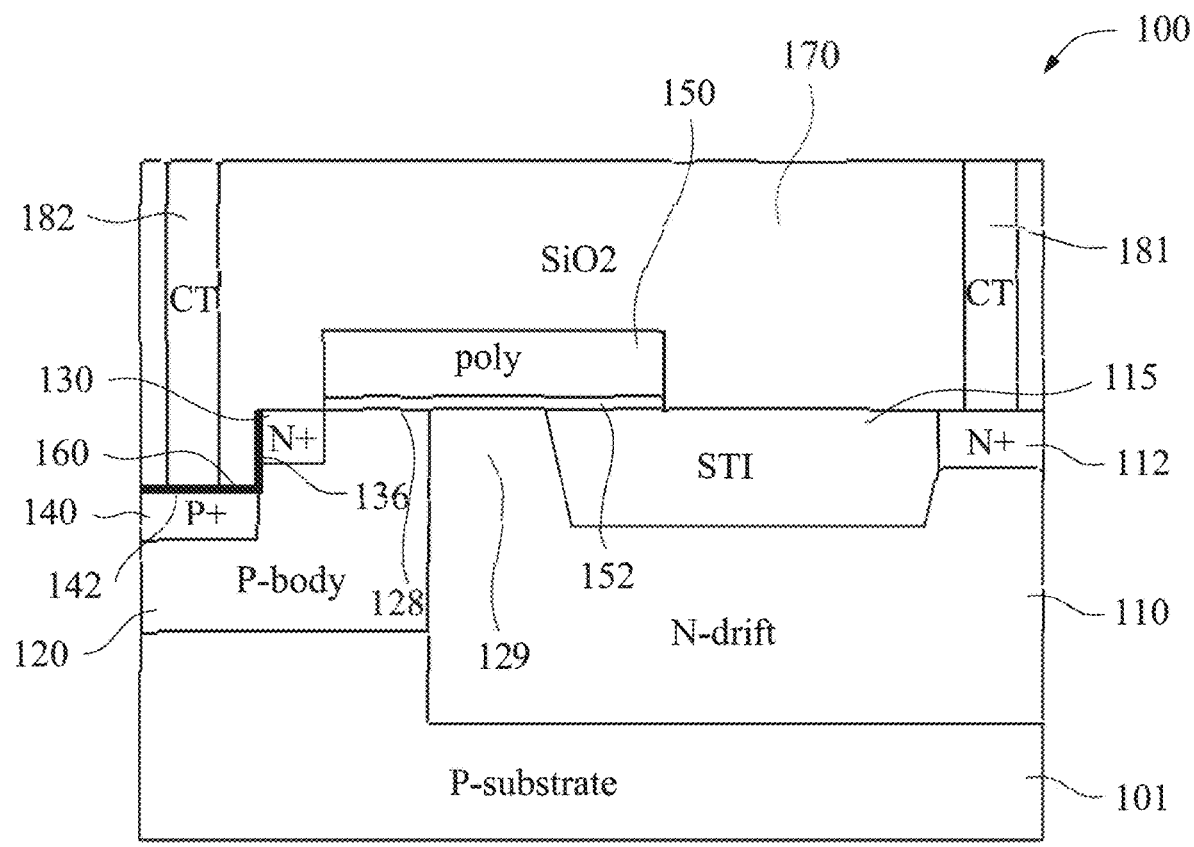
FIG. 1 is a cross-sectional view of an integrated circuit (IC) device, in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An LDMOS (laterally-diffused metal-oxide semiconductor) device generally includes a gate electrode on a gate dielectric layer overlying a channel region and a portion of a drift region. The drift region is in a first semiconductor region having a first-type conductivity. The channel region is within a second semiconductor region having a second-type conductivity. The channel region and the portion of the drift region is laterally located between a source region and a drain region. The drain region is in the first semiconductor region and the source region is in the second semiconductor region. The LDMOS device also includes a body contact region in the second semiconductor region. When the body contact region and the source region are positioned laterally next to each other, both the lateral size of the body contact region and the lateral size of the source region contribute to the size of the LDMOS device. Additionally, when the body contact region and the source region are positioned laterally next to each other, in some embodiments separate masks are used to define the boundaries of the body contact region and the source region during separate ion implantation processes for forming the two regions, because the body contact region and the source region have opposite conductivity types. When a spacer is used for forming a self-aligned source region during an ion implantation process, in some embodiments, the lateral size of the source region is reduced, and the number of the masks required for forming the body contact region and the source region is reduced.

FIG. 1 is a cross-sectional view of an integrated circuit (IC) device 100, in accordance with some embodiments. The IC device 100 is an LDMOS device. In FIG. 1, the IC device 100 includes a first semiconductor region 110 and a second semiconductor region 120. The first semiconductor region 110 has a first conductivity type. The second semiconductor region 120 has a second conductivity type. The first semiconductor region 110 has a drain region 112. An isolation region 115 in the first semiconductor region 110 is located laterally between the drain region 112 and the second semiconductor region 120. In some embodiments, the isolation region 115 is fabricated in the form of a Shallow Trench Isolation (STI). In FIG. 1, the second semiconductor region 120 has a source region 130 and a body contact region 140. A conformal conductive layer 160 covers an upper surface 142 of the body contact region 140 and a side surface 136 of the source region 130. In some embodiments, the conformal conductive layer 160 is a layer of metal silicide. A channel region 128, in the second semiconductor region 120, is located laterally between the source region 130 and the first semiconductor region 110. The IC device 100 includes a gate electrode 150 overlying a gate dielectric layer 152. The gate dielectric layer 152 overlies both the channel region 128 and a portion of the first semiconductor region 110.

In FIG. 1, a first contact plug 181 is connected to the drain region 112, and a second contact plug 182 is connected to the conformal conductive layer 160. Both the first contact plug 181 and the second contact plug 182 pass through a dielectric isolation layer 170 which covers the source region 130, the gate electrode 150, and the isolation region 115. The dielectric isolation layer 170 also covers portions of the conformal conductive layer 160 and the drain region 112. The first contact plug 181 is the drain terminal of the LDMOS device and the second contact plug 182 is the source terminal of the LDMOS device.

The LDMOS device fabricated is either a p-channel MOSFET or an n-channel MOSFET. In FIG. 1, the example LDMOS device 100 is an n-channel MOSFET. The first semiconductor region 110 is an n-type semiconductor region, and the second semiconductor region 120 is a p-type semiconductor region. Both the first semiconductor region 110 and the second semiconductor region 120 are fabricated on a p-type substrate or fabricated on a p-type epitaxial semiconductor layer supported by a substrate. The source region 130 and the drain region 112 have n-type conductivity, while the body contact region 140 has p-type conductivity. The body contact region 140 has a p-type carrier concentration higher than that in the p-type semiconductor of the second semiconductor region 120. The drain region 112 has an n-type carrier concentration higher than that in the n-type semiconductor of the first semiconductor region 110.

In operation, a voltage difference is applied between the gate electrode 150 and the source terminal (on the second contact plug 182) of the LDMOS device. When the voltage difference between the gate electrode 150 and the source terminal exceeds a threshold voltage, a current path will be established between the source region 130 and the drain region 112. When the current path is established, electron carriers move from the source region 130 to the drain region 112 through the channel region 128 in the second semiconductor region 120 and a drift region 129 in the first semiconductor region 110. The drift region between the channel region 128 and the drain region 112 helps the LDMOS device to achieve a high breakdown voltage that is required in high power applications. The IC device 100 in FIG. 1 is manufactured with techniques involving photolithography, ion-implantations, etching processes, and various material depositions.

Figure 2:
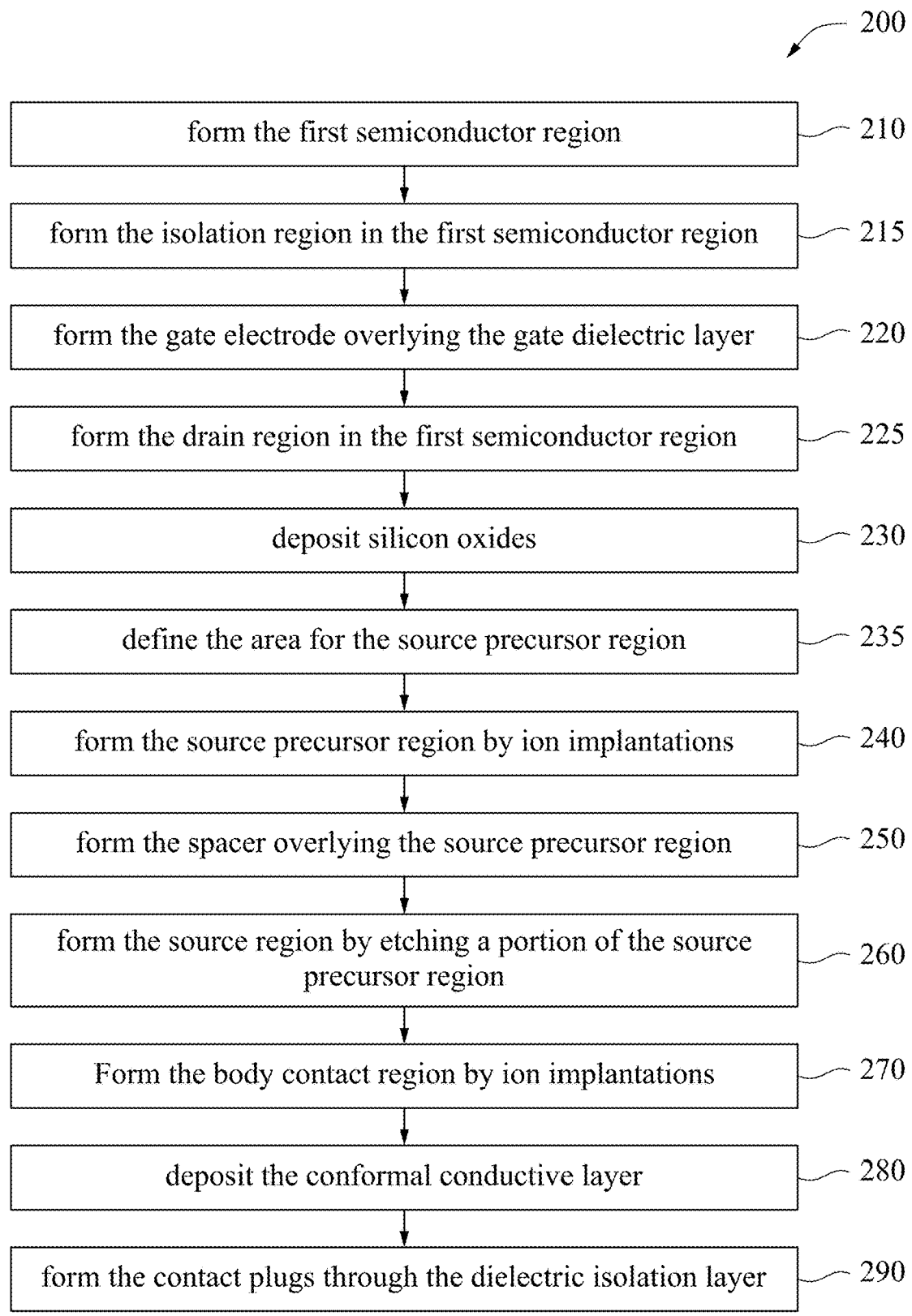
FIG. 2 is a flowchart of a method of manufacturing an IC device, in accordance with some embodiments.

FIG. 2 is a flowchart of a method 200 of manufacturing an IC device, in accordance with some embodiments. FIGS. 3A-3L are cross-sectional views of an IC device at various manufacturing stages according to method 200, in accordance with some embodiments.

Figure 3A:
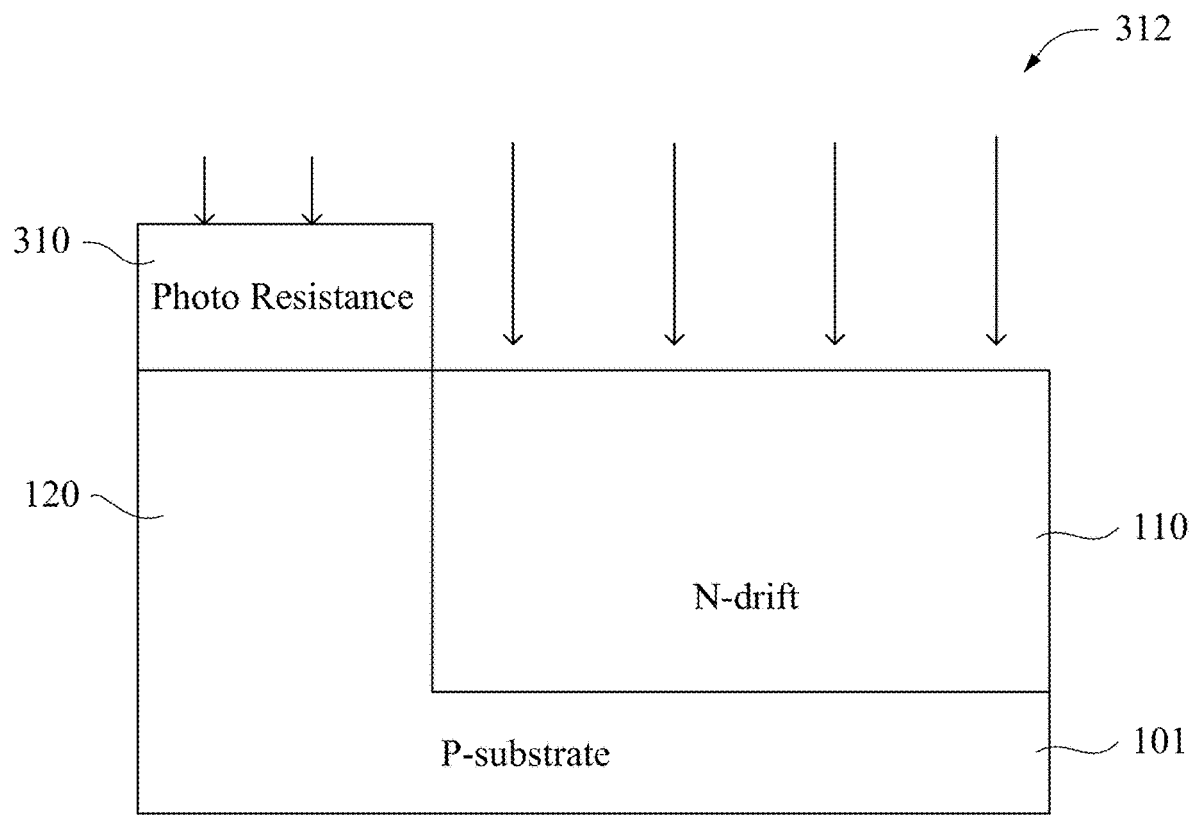
FIGS. 3A-3L are cross-sectional views of an IC device at various manufacturing stages, in accordance with some embodiments.

At operation 210, a first semiconductor region is formed. In the embodiment as shown in FIG. 3A, the first semiconductor region 110 having the n-type conductivity is formed on a p-type substrate 101. The first semiconductor region 110 is formed by doping a defined area with n-type dopants using ion implantation techniques. Examples of the n-type dopants include phosphorous, arsenic, nitrogen, antimony, a combination thereof, or other suitable materials. In some embodiments, the n-type doping density in the first semiconductor region 110 is in a range from about $10^{15}/cm^3$ to about $10^{18}/cm^3$. If the doping density is too large, then an ability to interrupt a current between the body contact region 140 and the drain region 112 in a final product is inhibited, in some instances. If the doping density is too low resistance in the first semiconductor region 110 is increased and the LDMOS is unable to properly function, in some instances. In FIG. 3A, the defined area for forming the n-type semiconductor region is provided by an opening 312 in a layer of photoresists 310. In some embodiments, the opening 312 in the layer of photoresists 310 is formed with photolithography techniques according to the patterns of a first photomask in a photomask set. During the ion implantation process for forming the first semiconductor region 110, regions of the substrate under the photoresists covered areas maintain the same conductivity type and become the second semiconductor region 120 having the p-type conductivity.

Figure 3B:
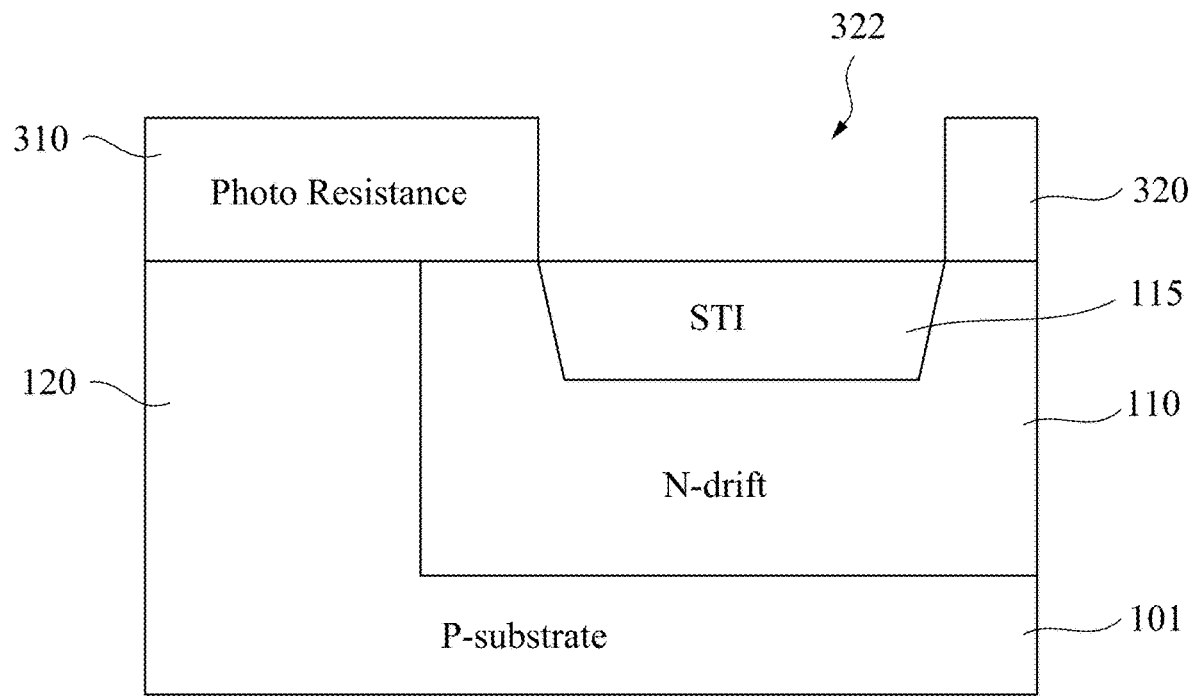

Next, at operation 215, an isolation region in the first semiconductor region is formed. In the embodiment as shown in FIG. 3B, the isolation region 115 is fabricated in the form of a Shallow Trench Isolation (STI). The area for forming the STI is defined by an opening 322 in a layer of photoresists 320. In some embodiments, the opening 322 in the layer of photoresists 320 is formed with photolithography techniques according to the patterns of a second photomask in a photomask set.

Figure 3C:
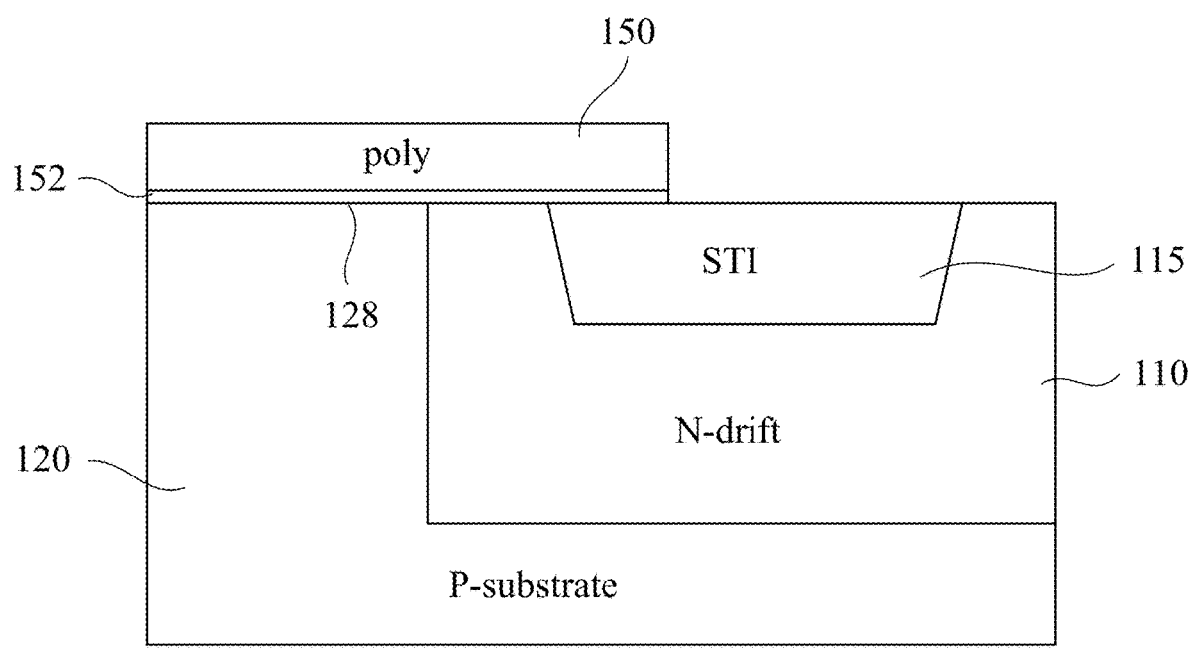

Next, at operation 220, a gate electrode overlying a gate dielectric layer is formed. In the embodiment as shown in FIG. 3C, the gate electrode 150 and the gate dielectric layer 152 covers the channel region 128 and a portion of the first semiconductor region 110. The gate electrode 150 and the gate dielectric layer 152 extend into the first semiconductor region 110 with sufficient length to facilitate the injection of the electron carriers from the channel region 128 to the drift region in the first semiconductor region 110. In the embodiment as shown in FIG. 3C, the extension of the gate electrode 150 and the gate dielectric layer 152 covers a part of the Shallow Trench Isolation (STI). The gate electrode 150 and the gate dielectric layer 152 forms the gate of the LDMOS device for controlling the conductivity between the source and the drain of the LDMOS device. During the fabrication of the LDMOS device, dielectric materials are deposited onto the surface covering a first semiconductor region 110 and a second semiconductor region 120. Examples of the dielectric materials include silicon oxide, silicon oxynitride, hafnium oxide, and zirconium oxide. In some embodiments, the gate dielectric layer 152 has a thickness in a range from about 3 nanometer to 40 nanometers. If the thickness is too large, a threshold voltage for turning on the LDMOS becomes too large, in some instances. If the thickness is too small, a risk of the gate electrode 150 electrically connecting directly to the first semiconductor region 110 is increased, in some instance. Following the deposition of the dielectric materials, conductive materials are deposited onto the layer of the dielectric materials. Examples of the conductive materials deposited include polysilicon, polysilicon germanium, nickel silicide, and other metal or metal alloy. Next, with photolithography processes, patterns of photoresists are formed over the layers of the conductive materials and the dielectric materials. Selected areas in the layers of the conductive materials and the dielectric materials are removed with dry etching processes, according to the patterns defined by the photoresists, to form the gate of the LDMOS device. In some embodiments, patterns of photoresists are formed with photolithography techniques using a third photomask in a photomask set.

Figure 3D:
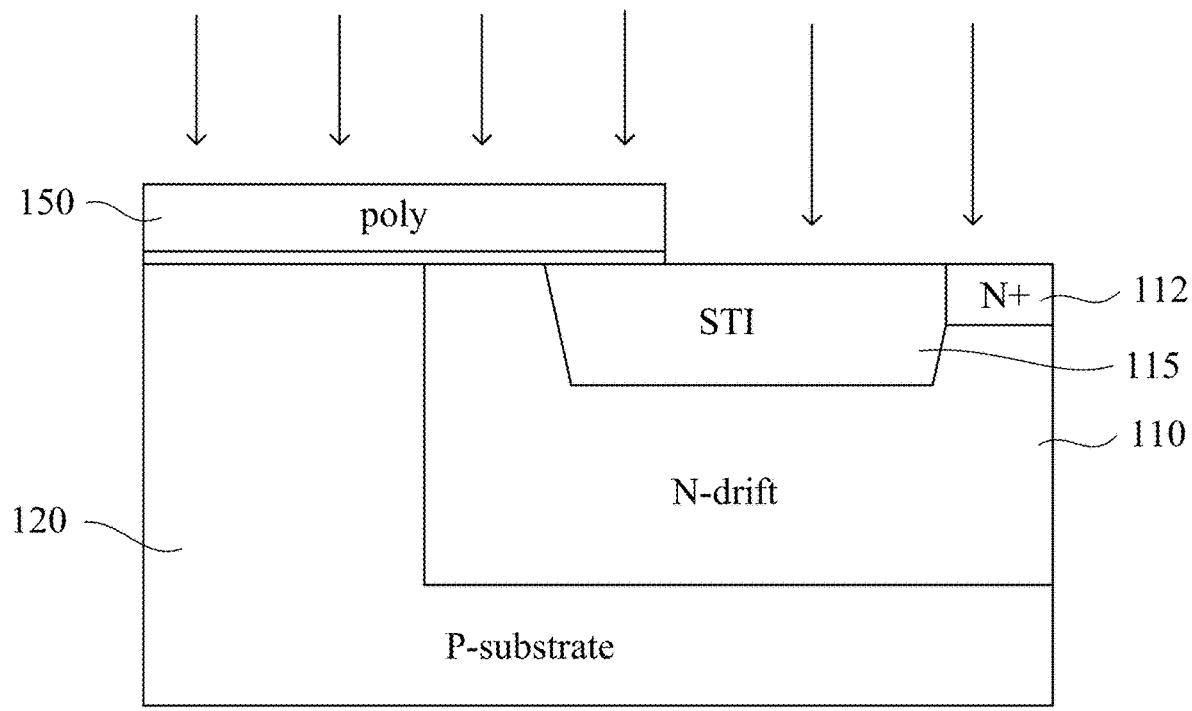

Next, at operation 225, the drain region in the first semiconductor region is formed. In the embodiment as shown in FIG. 3D, the drain region 112 in the first semiconductor region 110 is formed by doping n-type dopants into the region using ion implantation techniques. Examples of the n-type dopants for doping the drain region 112 include phosphorous, arsenic, nitrogen, antimony, a combination thereof, or other suitable materials. In some embodiments, the n-type doping density in the drain region 112 is in a range from about $10^{19}/cm^3$ to about $10^{21}/cm^3$. The doping density is chosen to be sufficiently high to form ohmic contact with additional conductive layer for connecting to the drain region 112. Regions other than the drain region 112 are protected by the gate electrode 150 and the isolation region 115 from ion bombardments during the ion implantation processes, and the conductivity properties of the protected regions, such as, the first semiconductor region 110 and the drift region under the gate electrode 150 and the isolation region 115, are not changed.

Figure 3E:
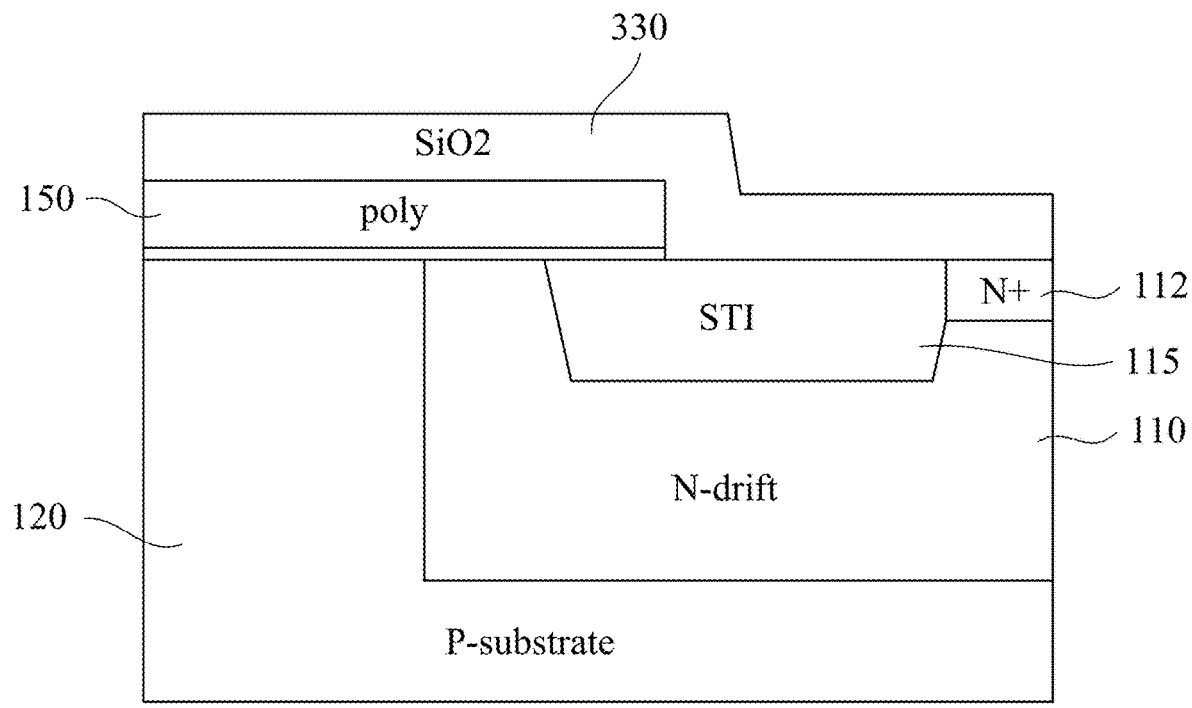

Next, at operation 230, silicon oxides are deposited on the device structure formed at operation 225. In the embodiment as shown in FIG. 3E, after the silicon oxides deposition, a layer of silicon oxides 330 covers the gate electrode 150, the isolation region 115, the drain region 112, and other surfaces of the first semiconductor region 110 and the second semiconductor region 120. The process flow then proceeds to operation 235.

Figure 3F:
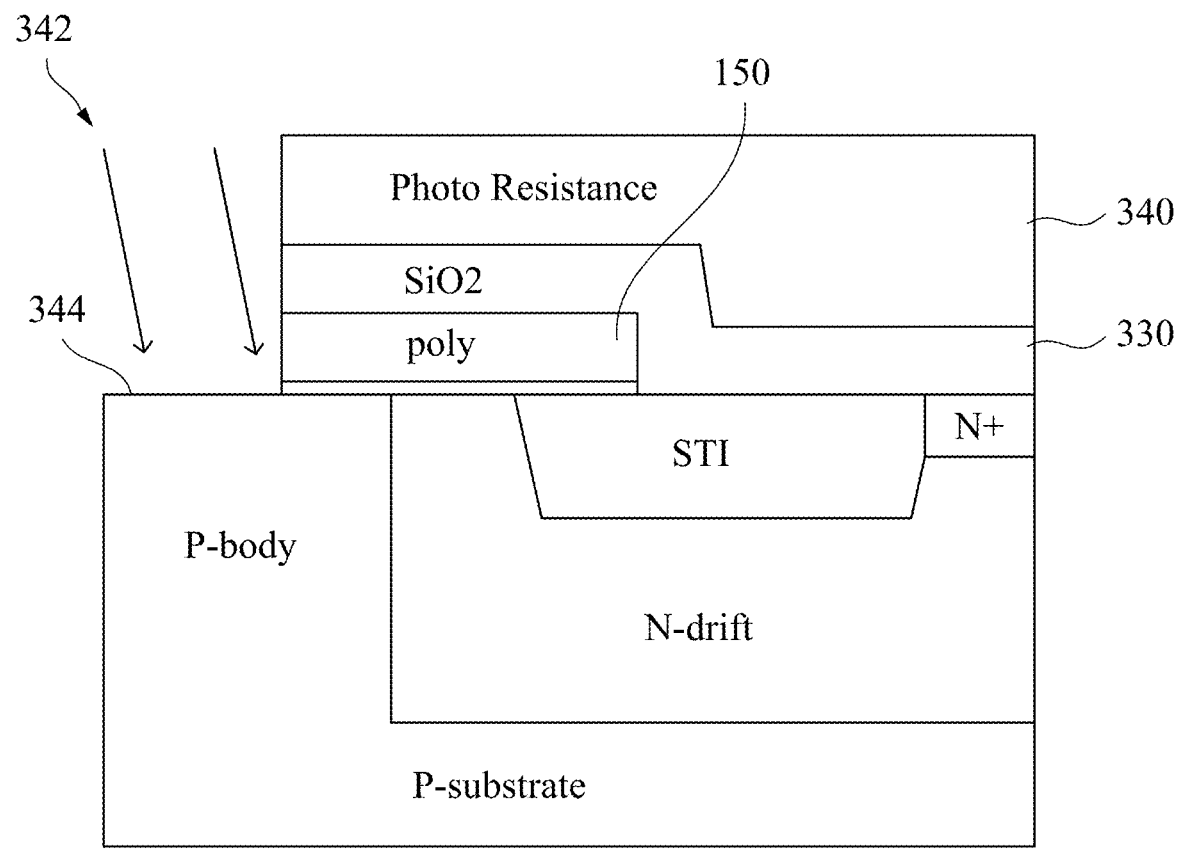

At operation 235, the area for forming the source precursor region is defined with photolithography techniques. In the embodiment as shown in FIG. 3F, the area for forming the source precursor region is defined by an opening 342 in a layer of photoresists 340. In some embodiments, the opening 342 in the layer of photoresists 340 is formed with photolithography techniques according to the patterns of a fourth photomask in a photomask set. After the patterns including the opening 342 are formed in the layer of photoresists 340, the silicon oxides 330 and the gate electrode 150 under the opening 342 in the layer of photoresists 340 are removed by dry etching processes, and a surface area 344 in the second semiconductor region 120 is exposed. Then, the layer of photoresists 340 is removed with photoresist stripper, and the process flow proceeds to operation 240.

Figure 3G:
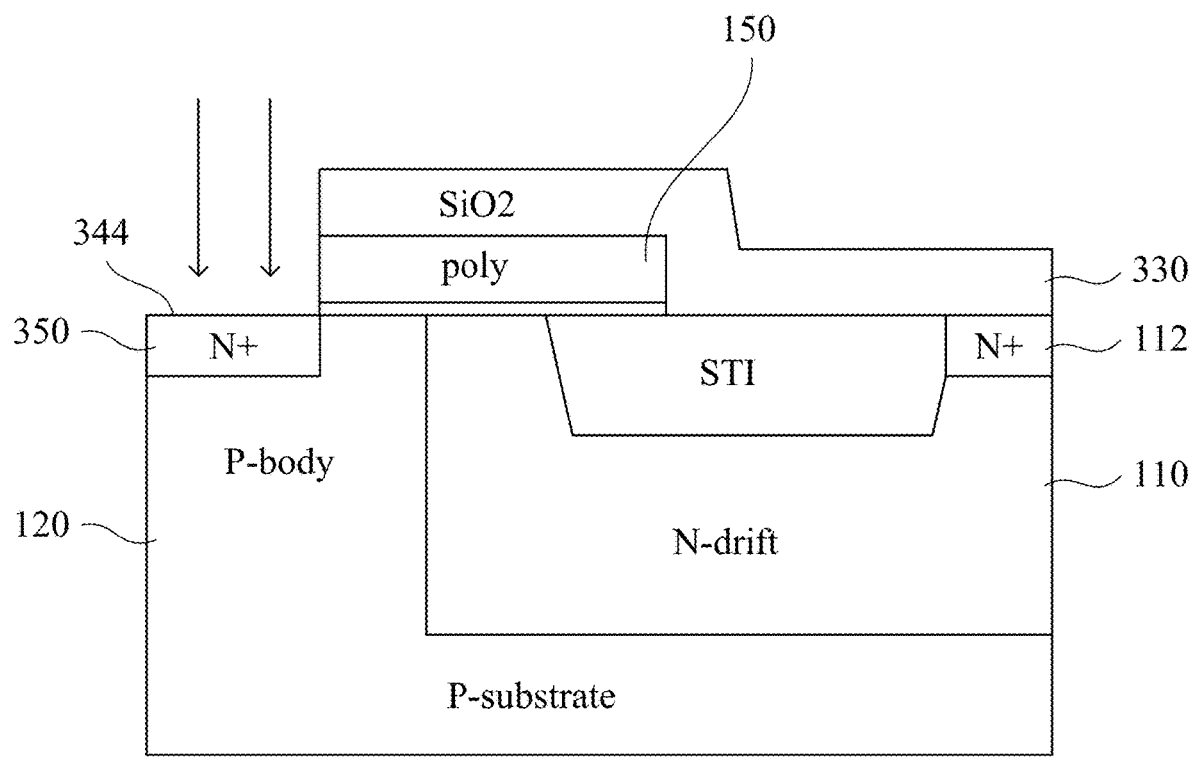

At operation 240, the source precursor region is formed with ion implantations. In the embodiment as shown in FIG. 3G, the source precursor region 350 having the n-type conductivity is formed under the surface area 344 by doping n-type dopants into the region using ion implantation techniques. Examples of the n-type dopants for doping the source precursor region 350 include phosphorous, arsenic, nitrogen, antimony, a combination thereof, or other suitable materials. In some embodiments, the n-type doping density in the source precursor region 350 is in a range from about $10^{19}/cm^3$ to about $10^{20}/cm^3$. The doping density is chosen to be sufficiently high for forming ohmic contact with additional conductive layer for connecting with a portion of the source precursor region 350. During the ion implantation process, while the conductivity of the semiconductor regions under the surface area 344 is changed by the ion doping, other semiconductor regions in the device structure of FIG. 3G are protected by the silicon oxides 330. After the ion implantations, the source precursor region 350 will have the n-type conductivity while the remaining regions in the second semiconductor region 120 have the p-type conductivity. The conductivity of the first semiconductor region 110 and the drain region 112 are not changed by the ion implantations because of the protection provided by the silicon oxides 330.

Figure 3H:
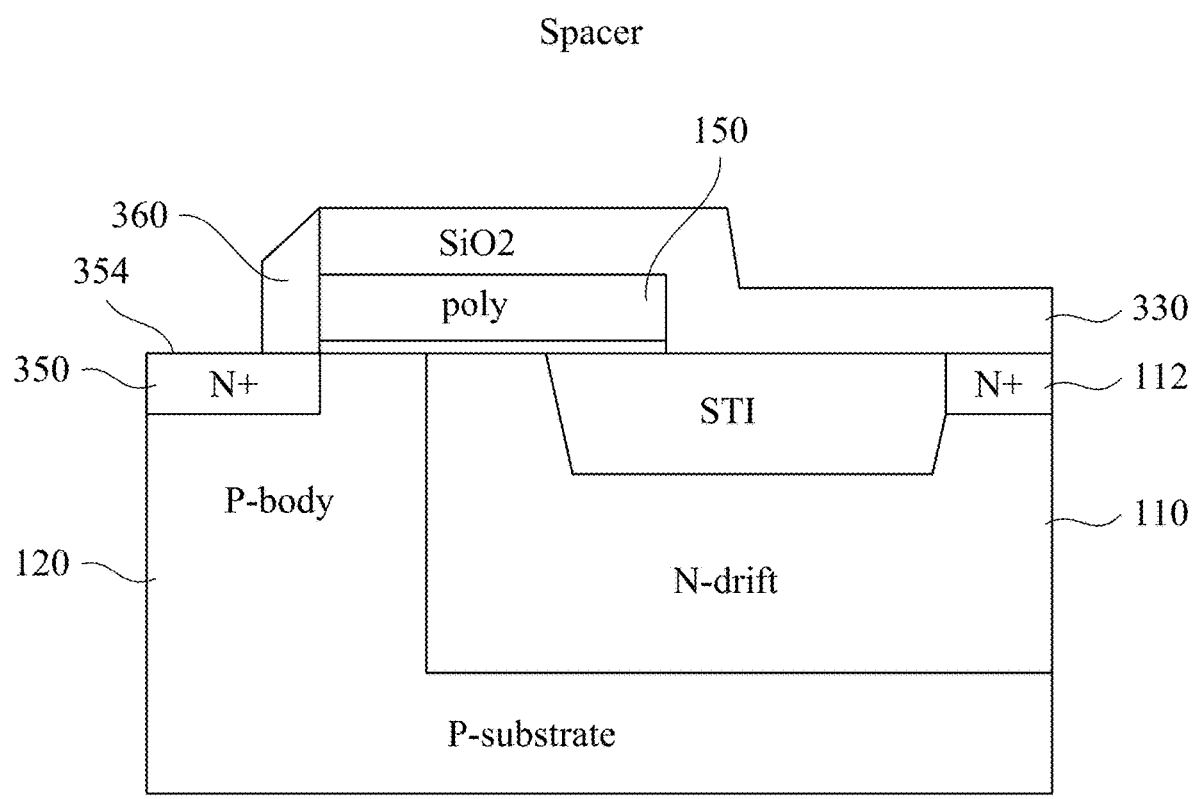

Next, at operation 250, the spacer overlying the source precursor region is formed. In the embodiment as shown in FIG. 3H, a spacer 360 is formed on a side wall of the gate electrode 150 and a side wall of the silicon oxides 330. In some embodiments, for forming the spacer 360, a spacer layer is deposited onto the layer of the silicon oxides 330 and onto the side walls of the gate electrode 150 and the silicon oxides 330 with blanket depositing techniques. Examples of the materials for the spacer layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (his-benzocyclobutenes), SiLK (Dow Chemical, Midland, Mich.), polyimide, a combination thereof, or other suitable materials. The spacer layer is deposited with one or more of the techniques including CVD, plasma enhanced CVD (PECVD), low pressure CVD (LPCVD), atomic layer deposition (ALD), or sputtering. After the spacer layer deposition, the spacer layer materials on the horizontal surfaces of the silicon oxides 330 are removed using anisotropic etching and the spacer 360 is formed on the side walls of the gate electrode 150 and the silicon oxides 330. The process flow then proceeds to operation 260.

Figure 3I:
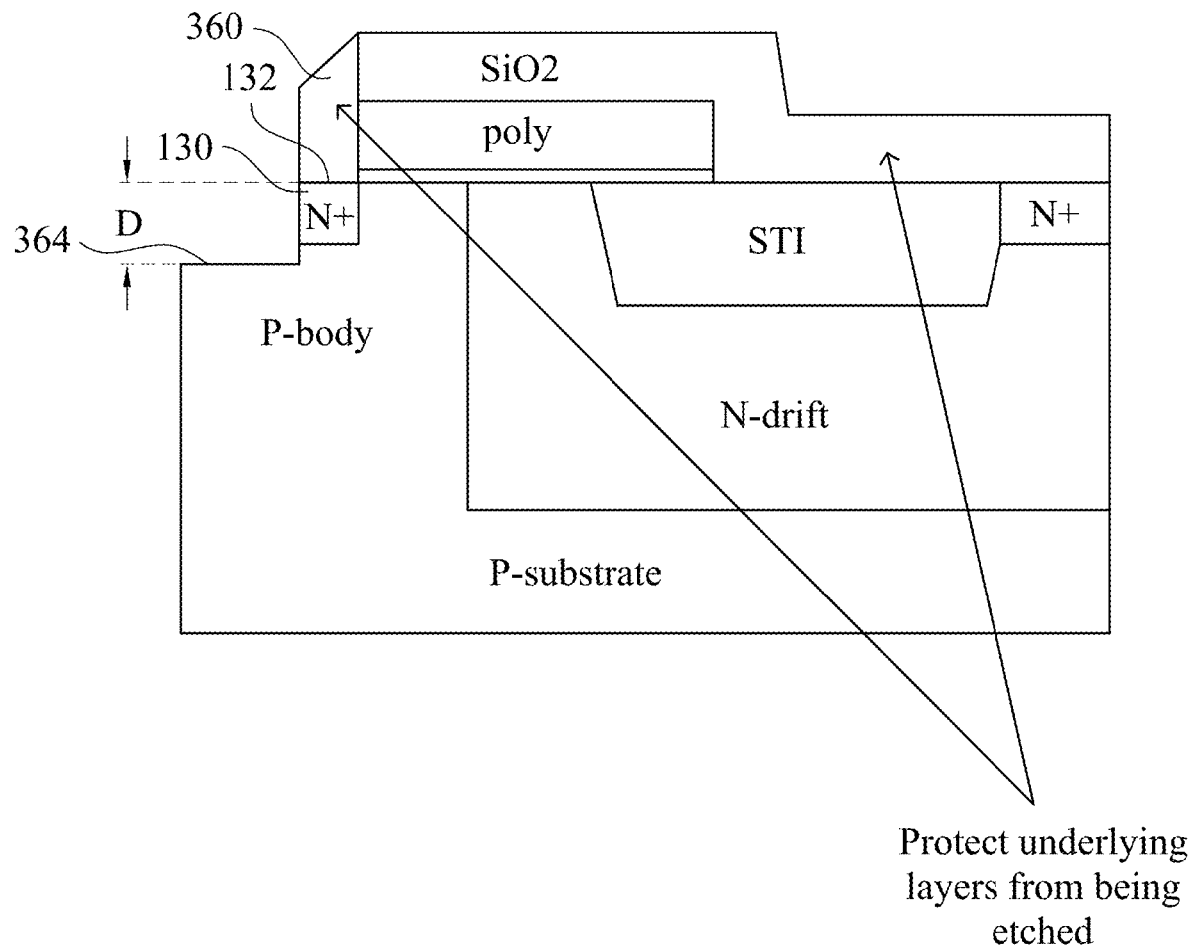

At operation 260, a portion of the source precursor region is etched with reactive ion etching and the source region is formed in the remaining part of the source precursor region. In the embodiment as shown in FIG. 3H, a surface region 354 in the source precursor region 350 unprotected by the spacer 360 is recessed by reactive ion etching. The plasma gas used in reactive ion etching has high selectivity between silicon and other materials, such as, silicon dioxides. While the surface region 354 is lowered during the etching process, other semiconductor regions in the device structure of FIG. 3H are protected by the silicon oxides 330 and the spacer 360. In the embodiment as shown in FIG. 3I, the semiconductor region underneath the spacer 360 becomes the source region 130 which is self-aligned with the gate electrode 150. The recessed surface 364 is lowered from the top surface 132 of the source region 130 by a depth "D".

Figure 3J:
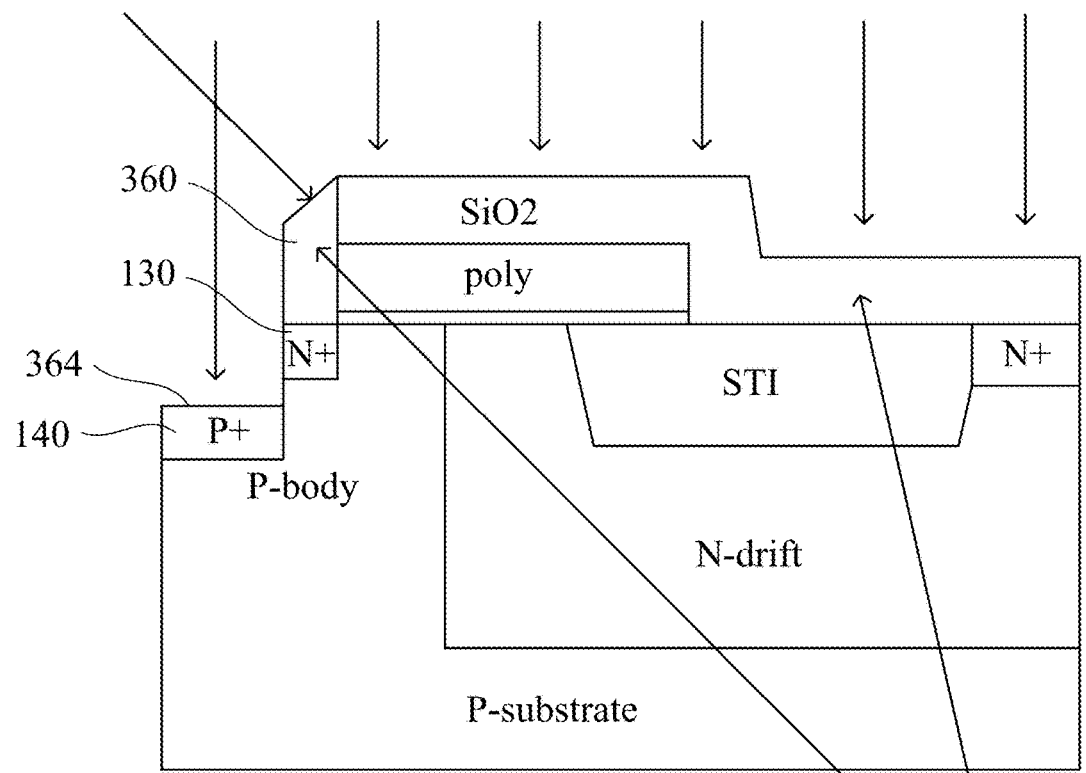

Next, at operation 270, the body contact region is formed by ion implantations. In the embodiment as shown in FIG. 3J, the body contact region 140 is formed under the surface 364 by doping p-type dopants into the region using ion implantation techniques. Examples of the p-type dopants for doping the body contact region 140 include boron, gallium, aluminum, indium, a combination thereof, or other suitable materials. In some embodiments, the doping density in the body contact region 140 is in a range from about $10^{19}/cm^3$ to about $10^{21}/cm^3$. The doping density is chosen to be sufficiently high to form ohmic contact with additional conductive layer for connecting to the body contact region 140. During the ion implantation process, while the conductivity of the semiconductor regions under the surface 364 is changed by the ion doping, other semiconductor regions in the device structure of FIG. 3J are protected by the silicon oxides 330 and the spacer 360. During the ion implantation process, the spacer 360 functions as a hard mask which defines a boundary of the body contact region 140. The body contact region 140 formed by the ion implantation is self-aligned with the source region 130. After the ion implantations, the body contact region 140 will have increased p-type conductivity while the conductivity of the source region 130, the first semiconductor region 110, and the drain region 112 are not changed by the ion implantations.

Figure 3K:
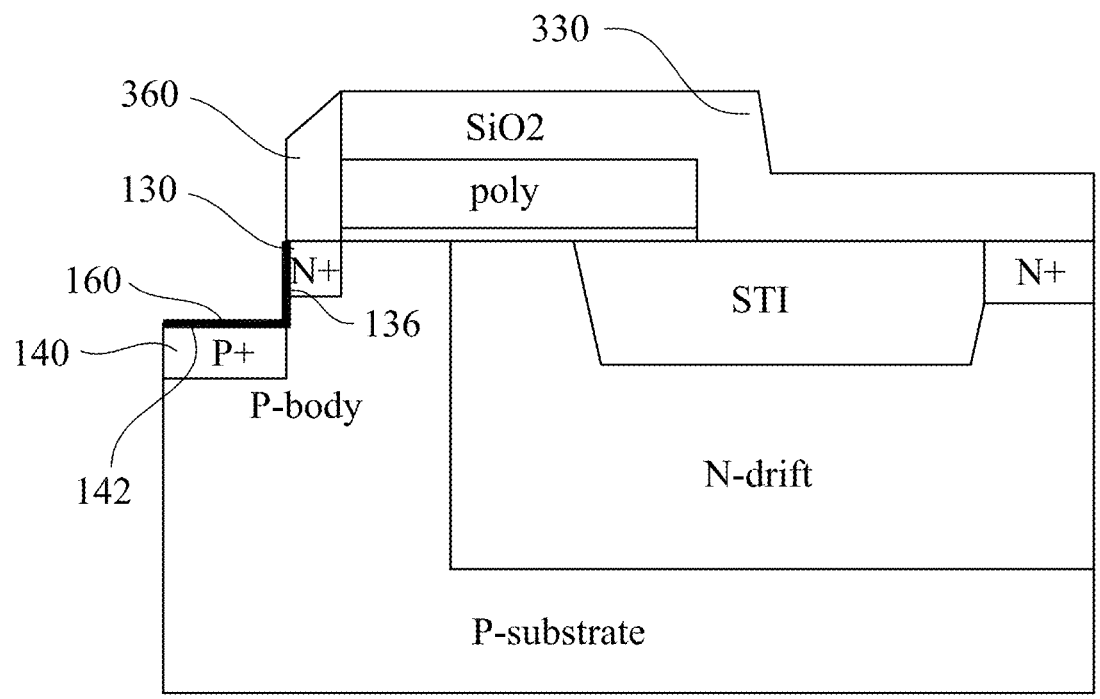

Next, at operation 280, the conformal conductive layer is deposited over an upper surface of the body contact region and a side surface of the source region. In the embodiment as shown in FIG. 3K, the conformal conductive layer 160 is deposited over an upper surface 142 of the body contact region 140 and a side surface 136 of the source region 130. In some embodiments, the conformal conductive layer 160 is a layer of metal silicide deposited by chemical vapor deposition (CVD). Examples of the metal silicide used for covering the upper surface 142 and the side surface 136 includes tungsten silicide, titanium silicide, copper silicide, cobalt silicide, nickel silicide, a combination thereof, or other suitable materials. During the CVD process, the exposed silicon on the upper surface 142 and the side surface 136 reacts with the chemical gases and forms silicide, while the surfaces of the silicon oxides 330 and the spacer 360 are free of silicide. In some embodiments, the conformal conductive layer 160 has a thickness in a range from about 10 nanometer to 50 nanometers. If the thickness is too thin, silicide may not be effectively formed, the resistance will increase and affect the device characteristics. If the thickness is too thick, the process time will be long. It may also cause Silicide to directly connect with the light doping well, forming Schottky contact, which affects the device characteristics. Following operation 280, the process flow proceeds to operation 290.

Figure 3L:
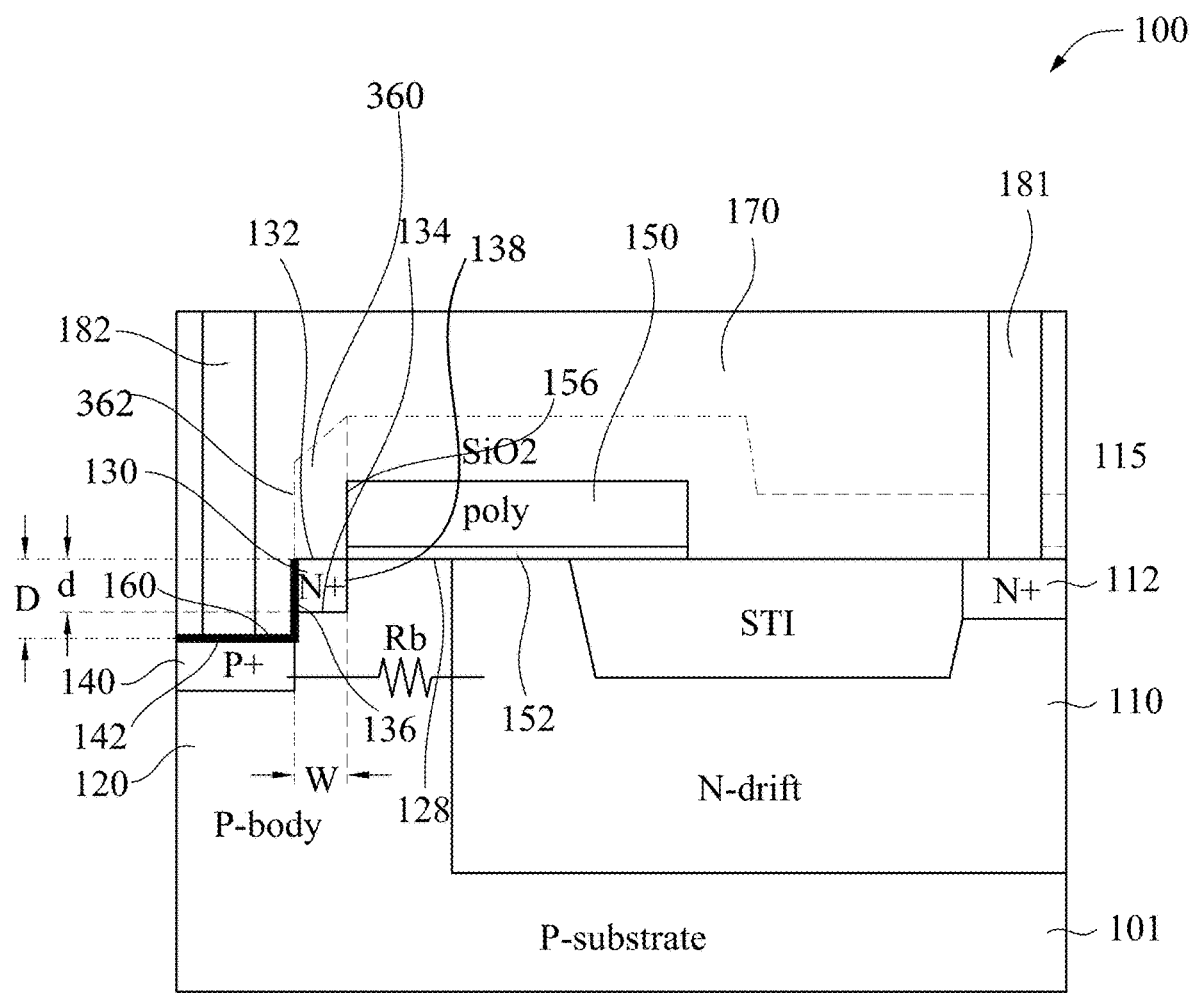

At operation 290, the contact plugs are formed passing through the dielectric isolation layer. In the embodiments as shown in FIG. 3L, the second contact plug 182 is connected to the conformal conductive layer 160 and the first contact plug 181 is connected to the drain region 112. Both the second contact plug 182 and the first contact plug 181 pass through the dielectric isolation layer 170. At operation 290, the dielectric isolation layer 170 is deposited onto the device structure of FIG. 3K. The deposited dielectric isolation layer 170 covers the surfaces of the silicon oxides 330, the spacer 360, the conformal conductive layer 160, and the drain region 112. In some embodiments, before the dielectric isolation layer 170 is deposited onto the device structure of FIG. 3K, the silicon oxides 330 and the spacer 360 are removed, and the deposited dielectric isolation layer 170 covers the surface of the conformal conductive layer 160, the gate electrode 150, the isolation region 115, and the drain region 112. In some embodiments, the silicon oxides 330 and the spacer 360 are removed, and the dielectric isolation layer 170 are directly deposited onto the surfaces of the device structure of FIG. 3K. At operation 290, after the deposited dielectric isolation layer 170 is covered with photoresists and patterned using lithography, vias and trenches following the patterns in the photoresists are formed in the deposited dielectric isolation layer 170 using etching techniques. After the vias and trenches are filled with metallic materials, excess materials on the upper surface of the dielectric isolation layer 170 are removed with a Chemical Mechanical Polishing (CMP) process, and the first contact plug 181 and the second contact plug 182 are formed in the dielectric isolation layer 170.

In some embodiments, at operation 290, the patterns in the photoresists are formed with photolithography techniques according to the patterns of a fifth photomask in a photomask set. In some embodiments, during the process flow from operation 210 to operation 290, a total of five photomasks are used, and the reduced total number of photomasks as compared with some alternative methods for fabricating LDMOS devices may simplify the device fabrication process.

When the method 200 as shown in the flowchart of FIG. 2 is used for manufacturing an LDMOS device, the source region 130 is self-aligned with the body contact region 140 and the gate electrode. As shown in FIG. 3L, the side surface 138 of the source region 130 is automatically aligned with the side 156 of the gate electrode 150 when the source precursor region 350 is formed with ion implantations at operation 240. The side surface 136 of the source region 130 is automatically aligned with the side 362 of the spacer 360 when the source region 130 is formed with reactive ion etching at operation 260. The side surface 148 of the body contact region 140 is automatically aligned with the side surface 136 of the source region 130 when the body contact region 140 is formed with ion implantations at operation 270.

Figure 4A:
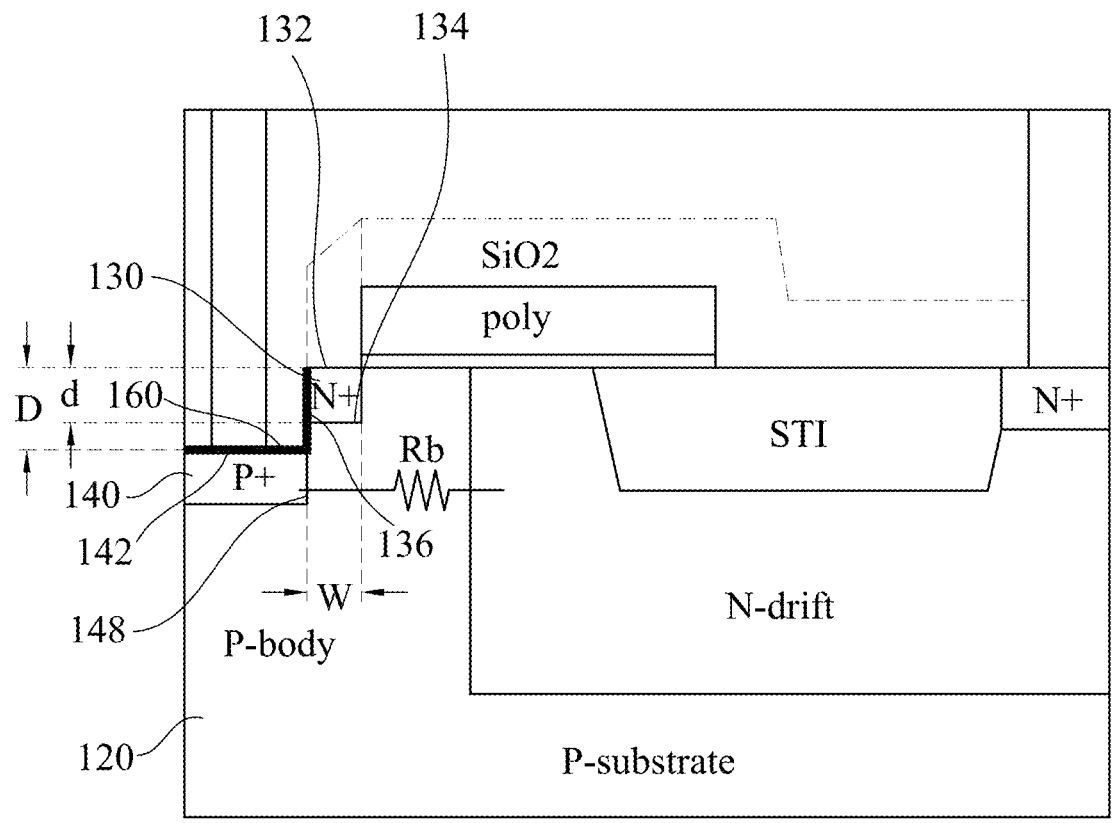
FIGS. 4A-4C are cross-sectional views of LDMOS devices, in accordance with some embodiments.
Figure 4B:
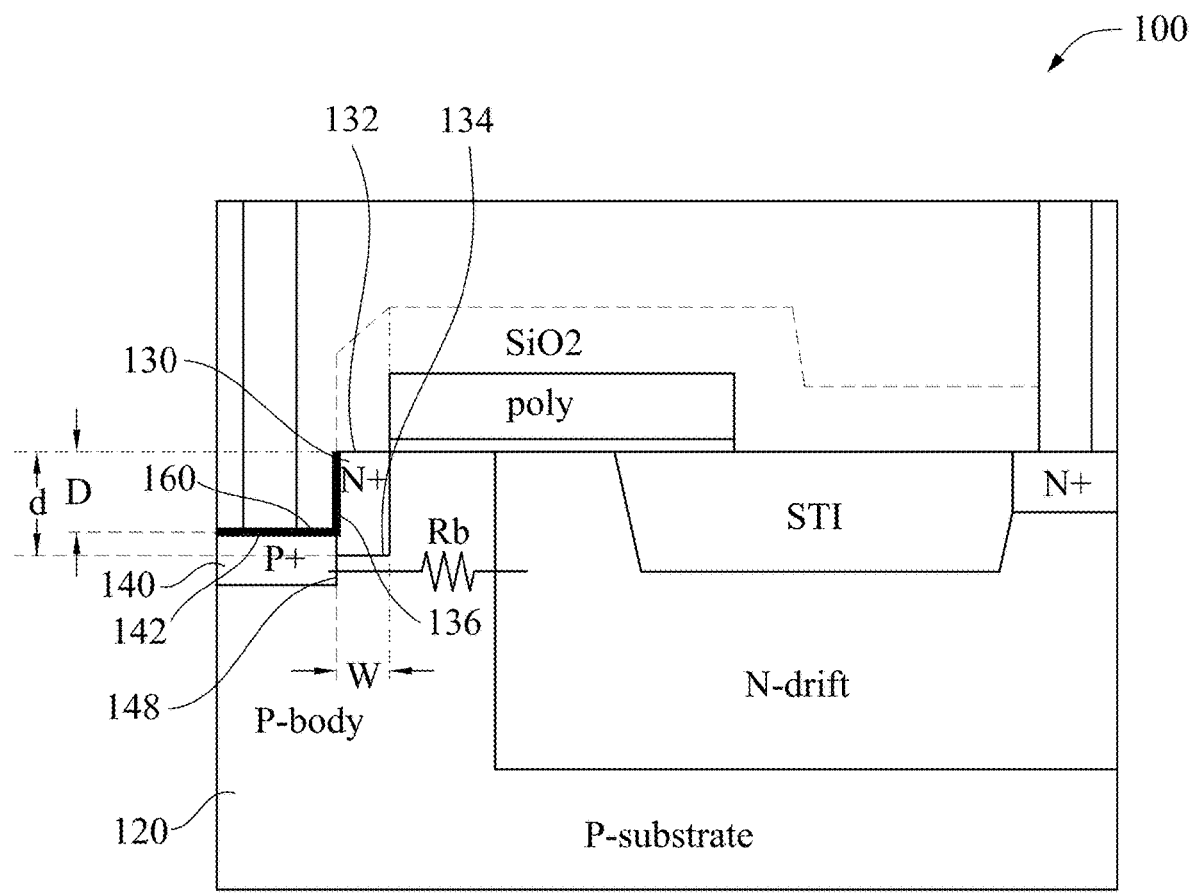

In the LDMOS devices in FIGS. 4A-4B, the width "W" of the source region 130 is determined by the width of the spacer 360 at operation 260. In some embodiments, the width "W" of the source region 130 is in a range from about 2 nm to about 15 nm. Other ranges of the width "W" are within the contemplated scope of the disclosure. The width "W" of the source region 130 in an LDMOS device fabricated with the method 200 is reduced when compared with the width of the source region in some other LDMOS devices fabricated with alternative technology. Reducing the width of the source region also reduces the overall width of the LDMOS device.

When the method of FIG. 2 is used for manufacturing an LDMOS device, such as the device in FIG. 4A or FIG. 4B, the depth "D" measured from the top surface 132 of the source region 130 to the upper surface 142 of the body contact region 140 is controllable at operation 260. In some embodiments, the depth "D" is in a range from about 100 nanometers to about 300 nanometers. Other ranges of the depth "D" are within the contemplated scope of the disclosure. Generally, the larger the depth "D", the smaller the base resistance Rb between the body contact region 140 and the drift region of the first semiconductor region 110. The smaller the base resistance Rb, the smaller the Kirk effect. The Kirk effect occurs when the base/drain undergoes "base pushout," the expansion of the base width with the flow of high current (e.g., a high concentration of carriers) moving between the drain and source (for, e.g., an LDMOS device). While generally it is preferable to have an LDMOS device with smaller base resistance Rb by increasing the depth "D" related to the body contact region 140, the upper limit of the depth "D" for an optimized LDMOS device depends upon other factors, such as whether the Schottky contact exists between the metal silicide 160 and the p-type body of the second semiconductor region 120.

In some embodiments, such as in the LDMOS device in FIG. 4A, the upper surface 142 of the body contact region 140 is recessed from the top surface 132 of the source region 130 with the depth "D" that is larger than or equal to the distance "d" between the top surface 132 of the source region 130 and the bottom surface 134 of the source region 130, which is D≥d. In some embodiments, such as in the LDMOS device in FIG. 4B, the upper surface 142 of the body contact region 140 is recessed from the top surface 132 of the source region 130 with the depth "D" that is smaller than the distance "d" between the top surface 132 of the source region 130 and the bottom surface 134 of the source region 130, which is D<d.

When the depth "D" is larger than or equal to the distance "d", as in FIG. 4A, the metal silicide 160 has direct contact with the p-type body of the second semiconductor region 120, and the Schottky contact is formed, in some embodiments, between the metal silicide 160 and the p-type body in some situations, because the p-type body is slightly doped. When the depth "D" is less than the distance "d", as in FIG. 4B, metal silicide 160 does not have direct contact with the p-type body of the second semiconductor region 120, which prevents the Schottky contact from being formed between the metal silicide 160 and the p-type body. It is also possible to have other embodiments of the LDMOS device in which the metal silicide 160 does not have direct contact with the p-type body of the second semiconductor region 120.

Figure 4C:
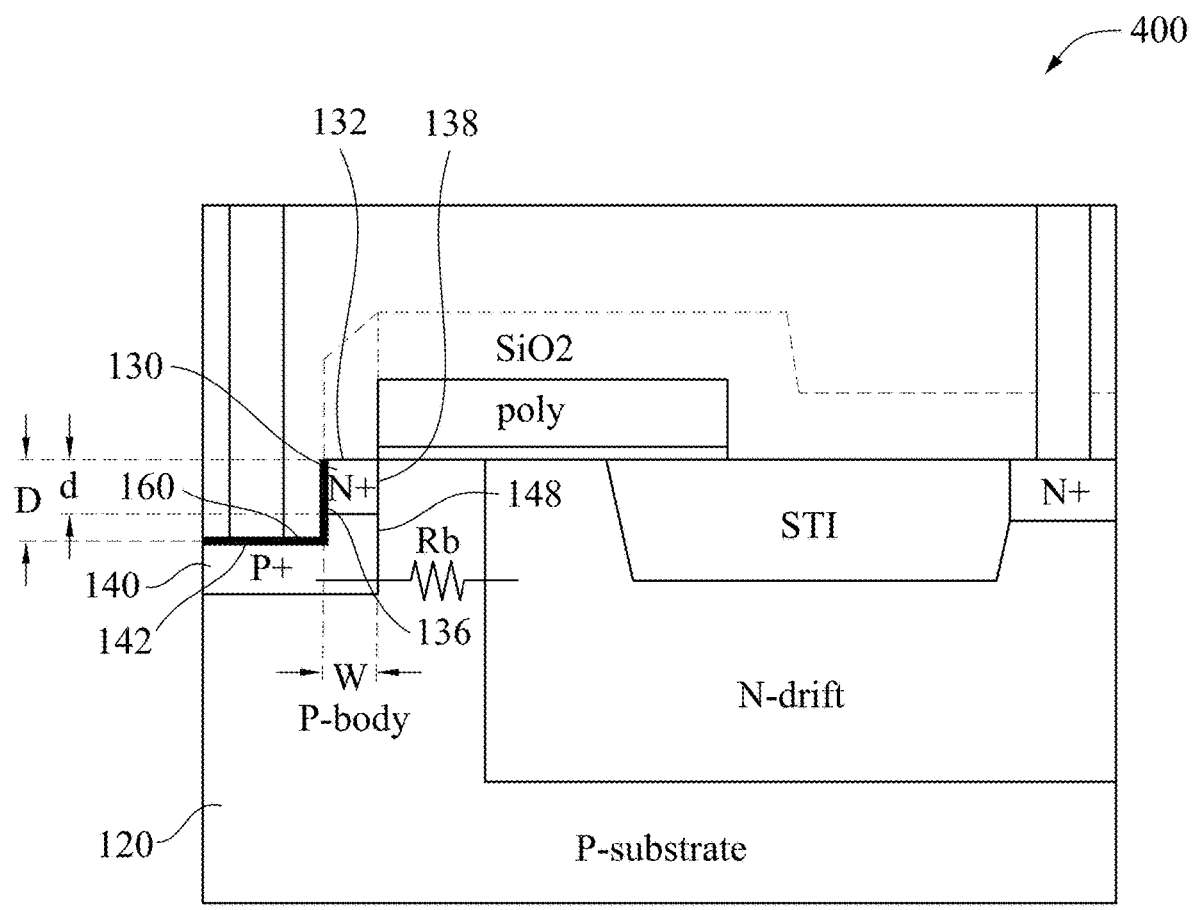

FIG. 4C is a cross-sectional view of an LDMOS device 400, in accordance with some embodiments. While the LDMOS device 400 in FIG. 4C has similar device structures as the LDMOS device 100 in FIG. 4A, the metal silicide 160 in FIG. 4C does not have direct contact with the p-type body. Unlike the device structure of FIG. 4B, where the side surface 148 of the body contact region 140 is vertically aligned with the side surface 136 of the source region 130, in the device structure of FIG. 4C, the side surface 148 of the body contact region 140 is vertically aligned with another side surface 138 of the source region 130, and the source region 130 overlies a portion of the body contact region 140.

Figure 5:
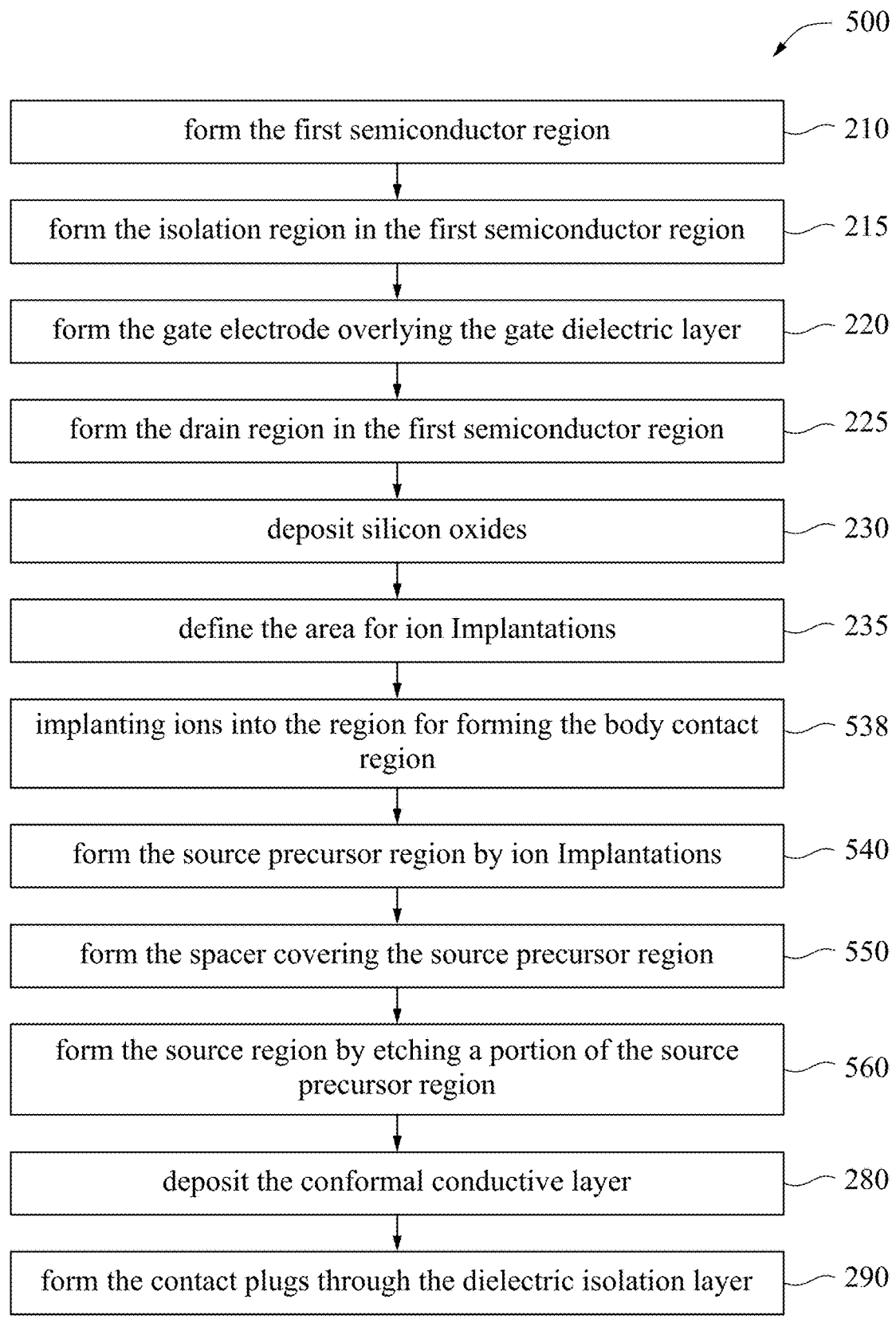
FIG. 5 is a flowchart of a method of manufacturing an IC device, in accordance with some embodiments.

FIG. 5 is a flowchart of a method 500 of manufacturing an IC device, in accordance with some embodiments. In some embodiments, the method 500 is used for manufacturing the LDMOS device 400 in FIG. 4C. FIGS. 6A-6F are cross-sectional views of an IC device at various manufacturing stages, in accordance with some embodiments.

Figure 6A:
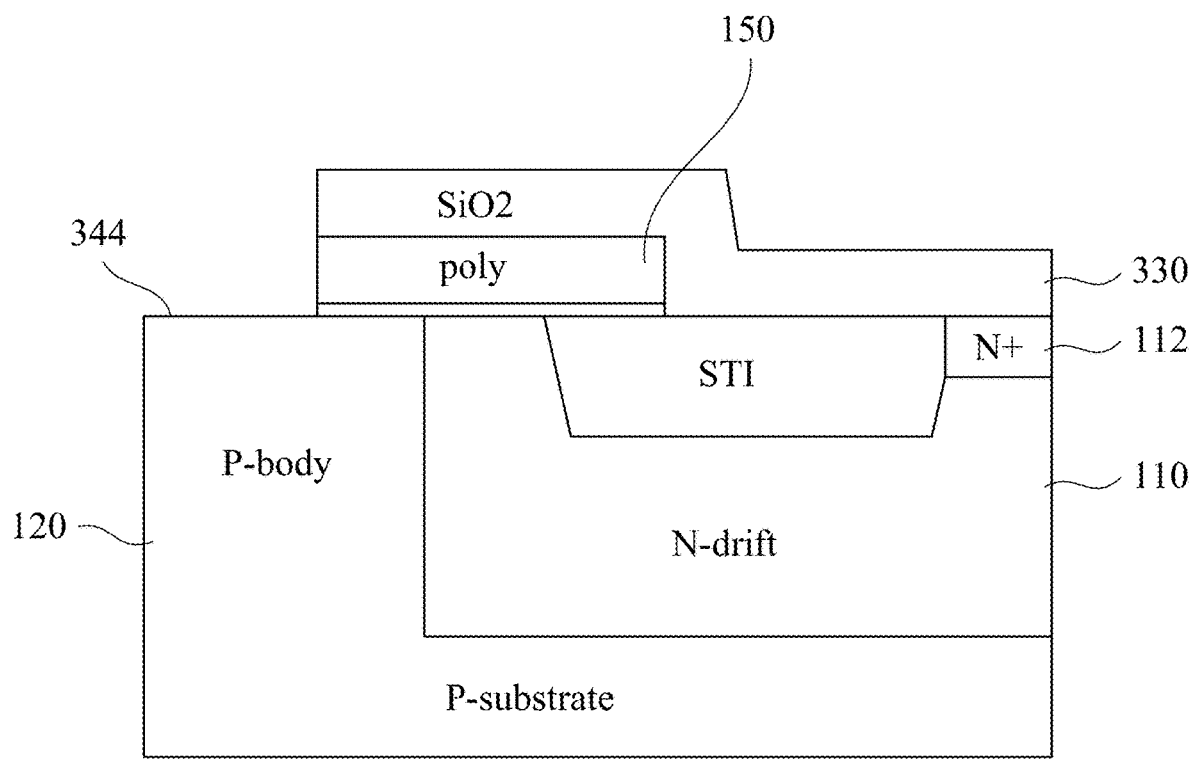
FIGS. 6A-6F are cross-sectional views of an IC device at various manufacturing stages, in accordance with some embodiments.
Figure 6B:
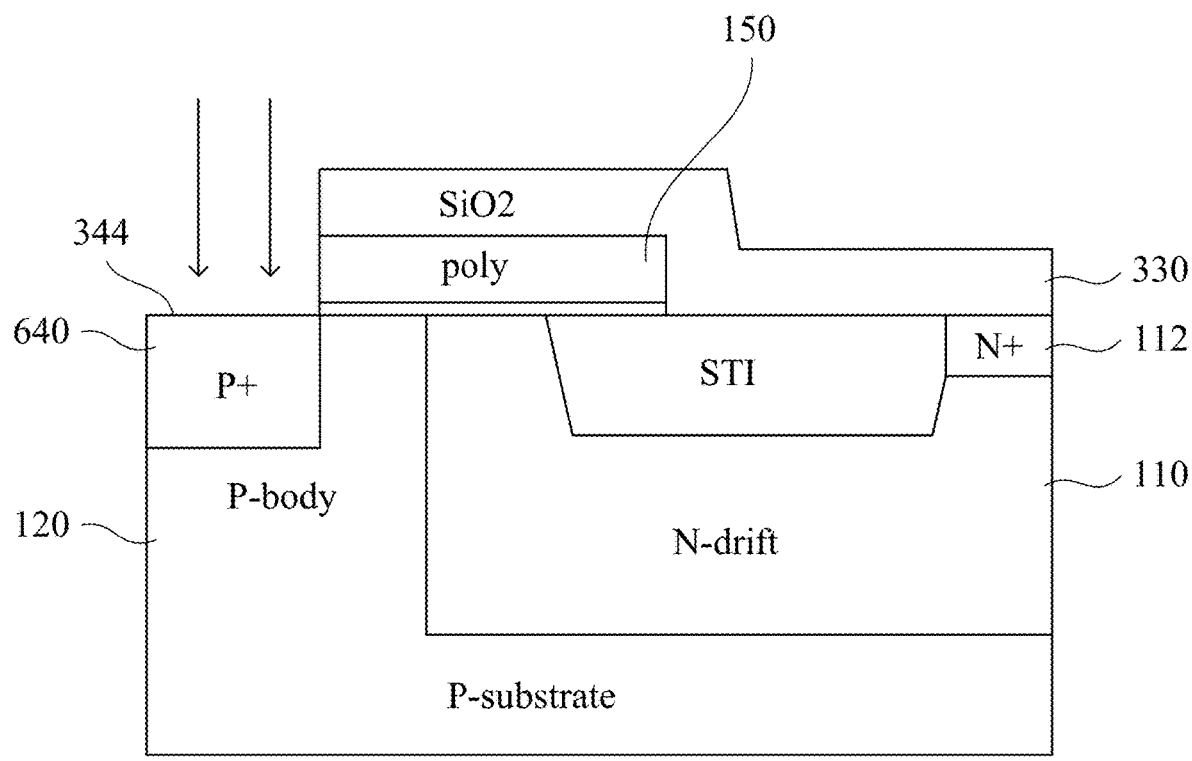
Figure 6C:
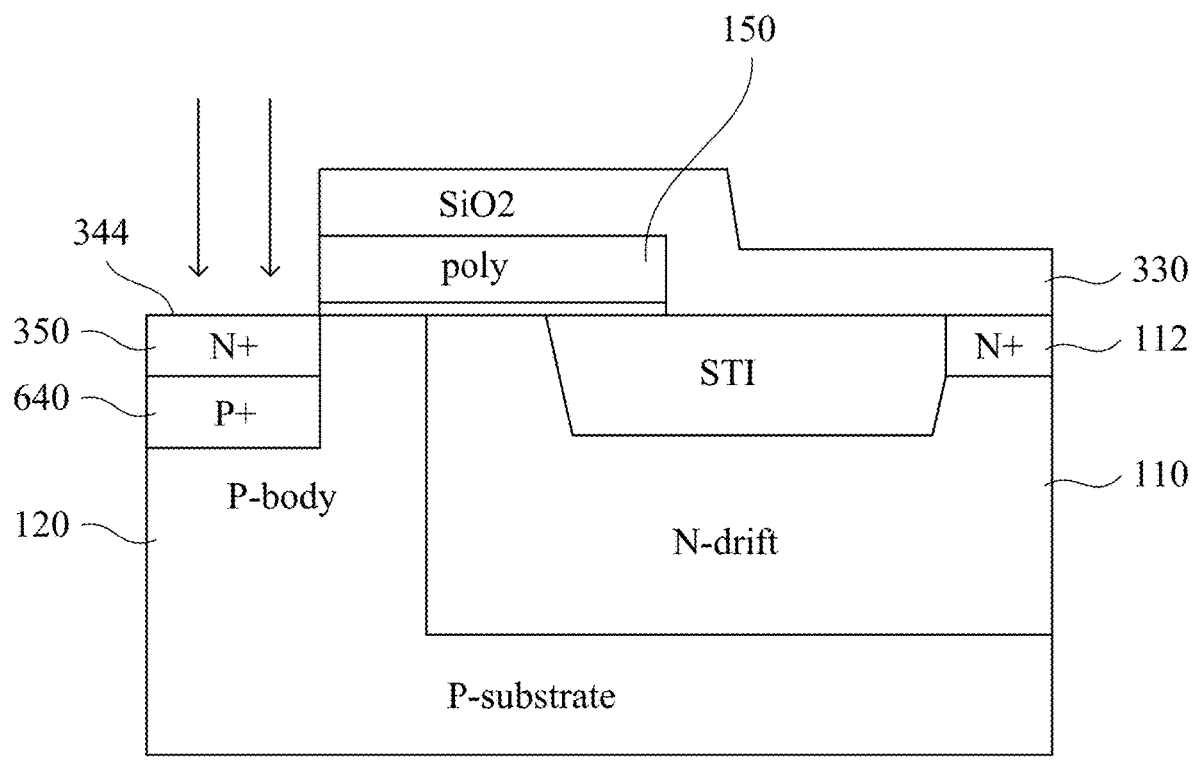
Figure 6D:
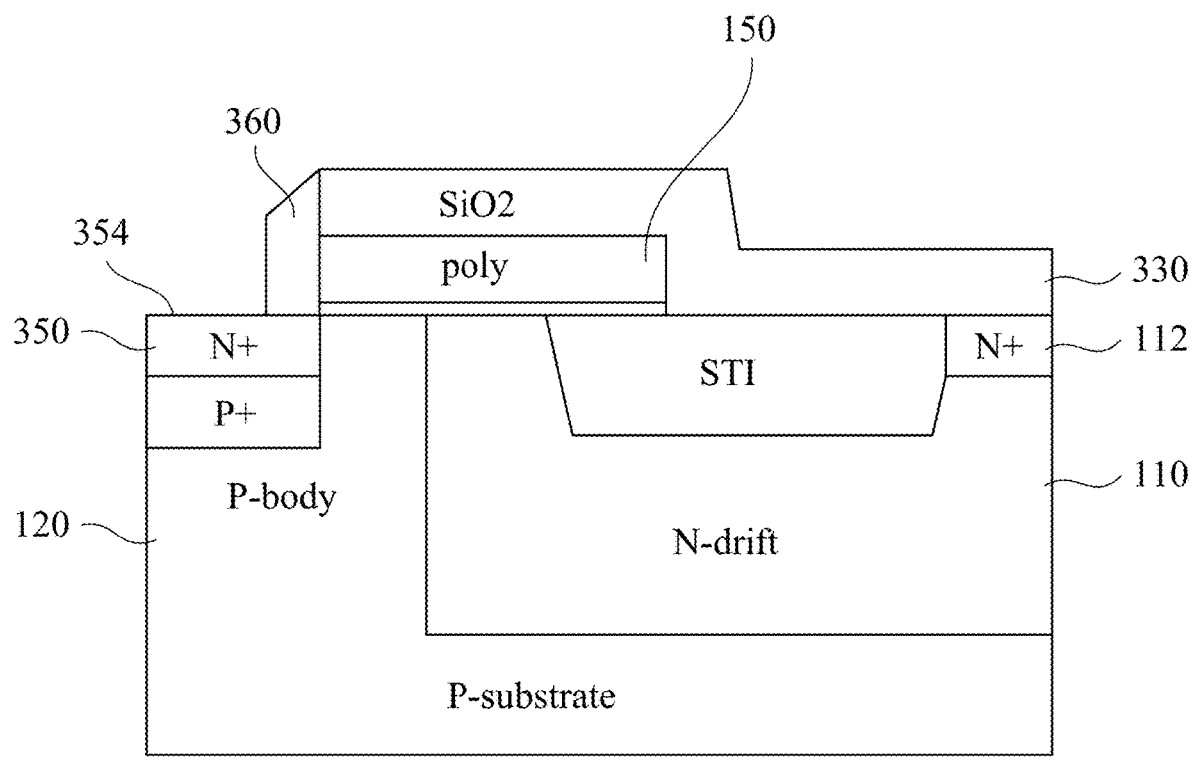
Figure 6E:
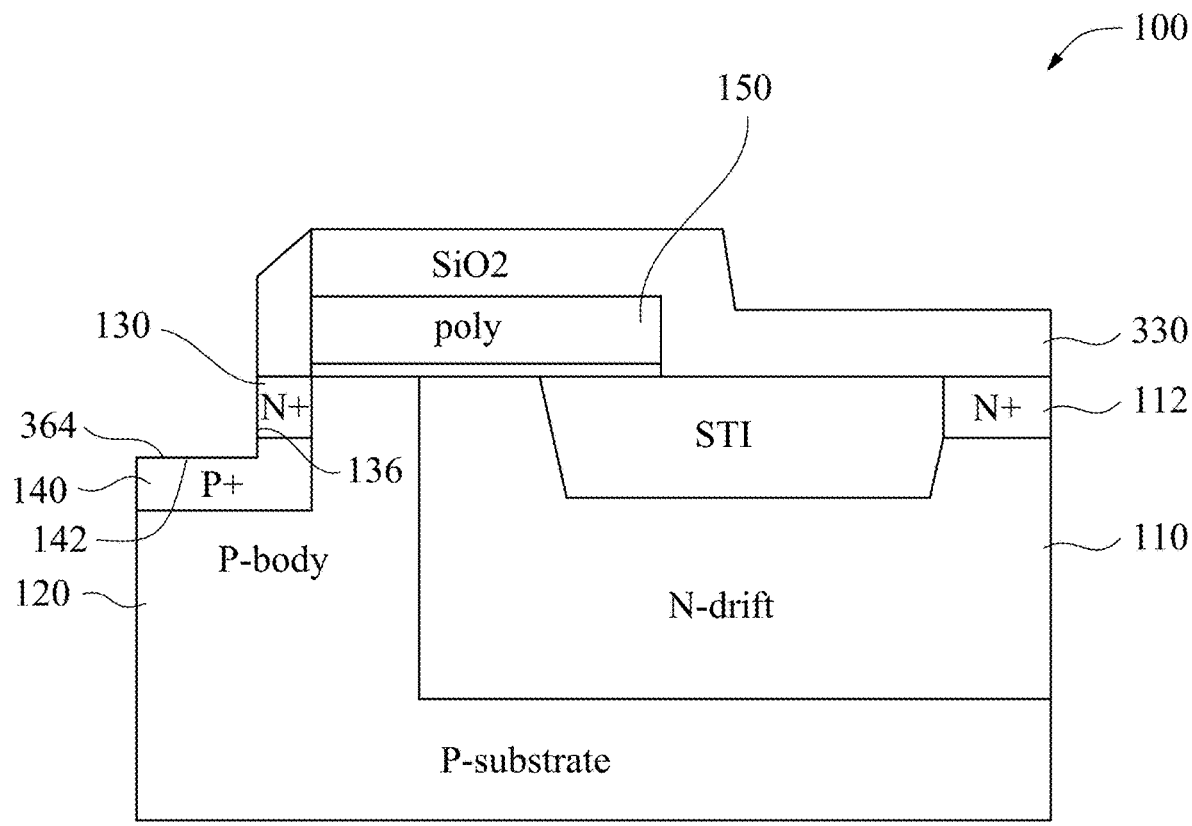
Figure 6F:
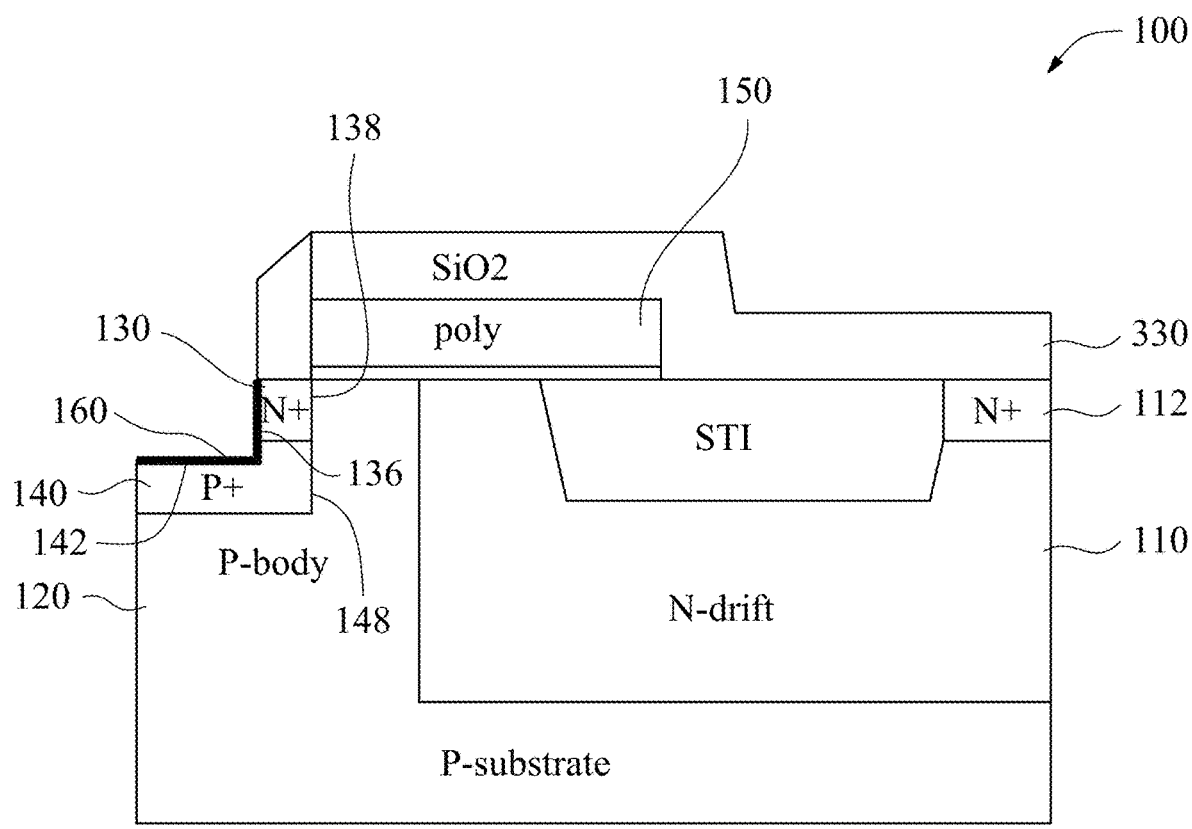

In the flowchart of FIG. 5, the operations 210-235 of the method 500 are identical to the similarly labeled operations 210-235 of the method 200 in FIG. 2. At the end of the operation 235, in some embodiments, the device structure as shown in FIG. 6A is formed. The device structure in FIG. 6A includes the gate electrode 150 on the gate dielectric layer 152 and also the drain region 112 and the isolation region 115 in the first semiconductor region 110. In FIG. 6A, the gate electrode 150 on the gate dielectric layer 152 overlies a portion of the first semiconductor region 110 and a portion of the second semiconductor region 120. An exposed surface area 344 is not covered by the silicon oxides 330. Following the operation 235 of the method 500 in FIG. 5, in the regions underneath the exposed surface area 344, the source region 130 and the body contact region 140 (as shown in FIG. 6E and FIG. 6F) are fabricated at operations 538-560.

At operation 538, the region for forming the body contact region 140 are implanted with ions. In the embodiment as shown in FIG. 6B, the region 640 underneath the exposed surface area 344 for forming the body contact region are implanted with ions. During the ion implantation process, while the conductivity of the semiconductor region 640 under the surface area 344 is changed by the ion doping, other semiconductor regions in the device structure of FIG. 6A are protected by the silicon oxides 330. After the ion implantations, the region 640 will have enhanced p-type carrier density than that in the rest of the second semiconductor region 120. In some embodiments, the p-type doping density in the region 640 is in a range from about $10^{19}/cm^3$ to about $10^{21}/cm^3$. The doping density is chosen to be sufficiently high to form ohmic contact with additional conductive layer. The conductivity of the first semiconductor region 110 and the drain region 112 are not changed by the ion implantations because of the protection provided by the silicon oxides 330.

At operation 540, the source precursor region is formed with ion implantations. In the embodiment as shown in FIG. 6C, the source precursor region 350 is formed in the upper part of the region 640. During the ion implantation process, while the type of the majority carriers in the upper part of the region 640 is changed by the ion doping, other semiconductor regions in the device structure of FIG. 6C are protected by the silicon oxides 330. After the ion implantations, the upper part of the region 640 becomes the source precursor region 350 and the lower part of the region 640 having the p-type conductivity becomes the body contact region. The conductivity of the first semiconductor region 110 and the drain region 112 are not changed by the ion implantations because of the protection provided by the silicon oxides 330.

Next, at operation 550, the spacer overlying the source precursor region is formed. In the embodiment as shown in FIG. 6D, a spacer 360 is formed on a side wall of the gate electrode 150 and a side wall of the silicon oxides 330. In some embodiments, the spacer 360 is formed at operation 550 in a process that is identical to the process at operation 250 of the method 200 in FIG. 2, and the spacer 360 is formed with a material that is identical to the material used at operation 250 for forming the spacer 360. The details of the process and the material for forming the spacer 360 at operation 550 is omitted.

Next, at operation 560, a portion of the source precursor region is etched with reactive ion etching and the source region is formed in the remaining part of the source precursor region. In the embodiment as shown in FIG. 6D, a surface region 354 in the source precursor region 350 unprotected by the spacer 360 is recessed by reactive ion etching. While the surface region 354 is lowered during the etching process, other semiconductor regions in the device structure of FIG. 6D are protected by the silicon oxides 330 and the spacer 360. In the embodiment as shown in FIG. 6E, the semiconductor region underneath the spacer 360 becomes the source region 130. In some embodiments, the n-type doping density in the source region 130 is in a range from about $10^{19}/cm^3$ to about $10^{21}/cm^3$. The doping density is chosen to be sufficiently high to form ohmic contact with additional conductive layer for connecting to the source region 130. The source region 130 overlies a portion of the body contact region 140, and the side surface 148 of the body contact region 140 is vertically aligned with another side surface 138 of the source region 130.

After operation 560, the process flow proceeds to operations 280-290. At operation 280, the conformal conductive layer is deposited over an upper surface of the body contact region and a side surface of the source region. In the embodiment as shown in FIG. 6F, the conformal conductive layer 160 is deposited over an upper surface 142 of the body contact region 140 and a side surface 136 of the source region 130. At operation 290, the contact plugs are formed passing through the dielectric isolation layer. After operation 290, the LDMOS device 400 in FIG. 4C is generated. In some embodiments, the processes at operations 280-290 of the method 500 in FIG. 5 are correspondingly identical to the processes at operations 280-290 of the method 200 in FIG. 2, and the details of the processes at operations 280-290 are not repeated with respect to the method 500.

Figure 7:
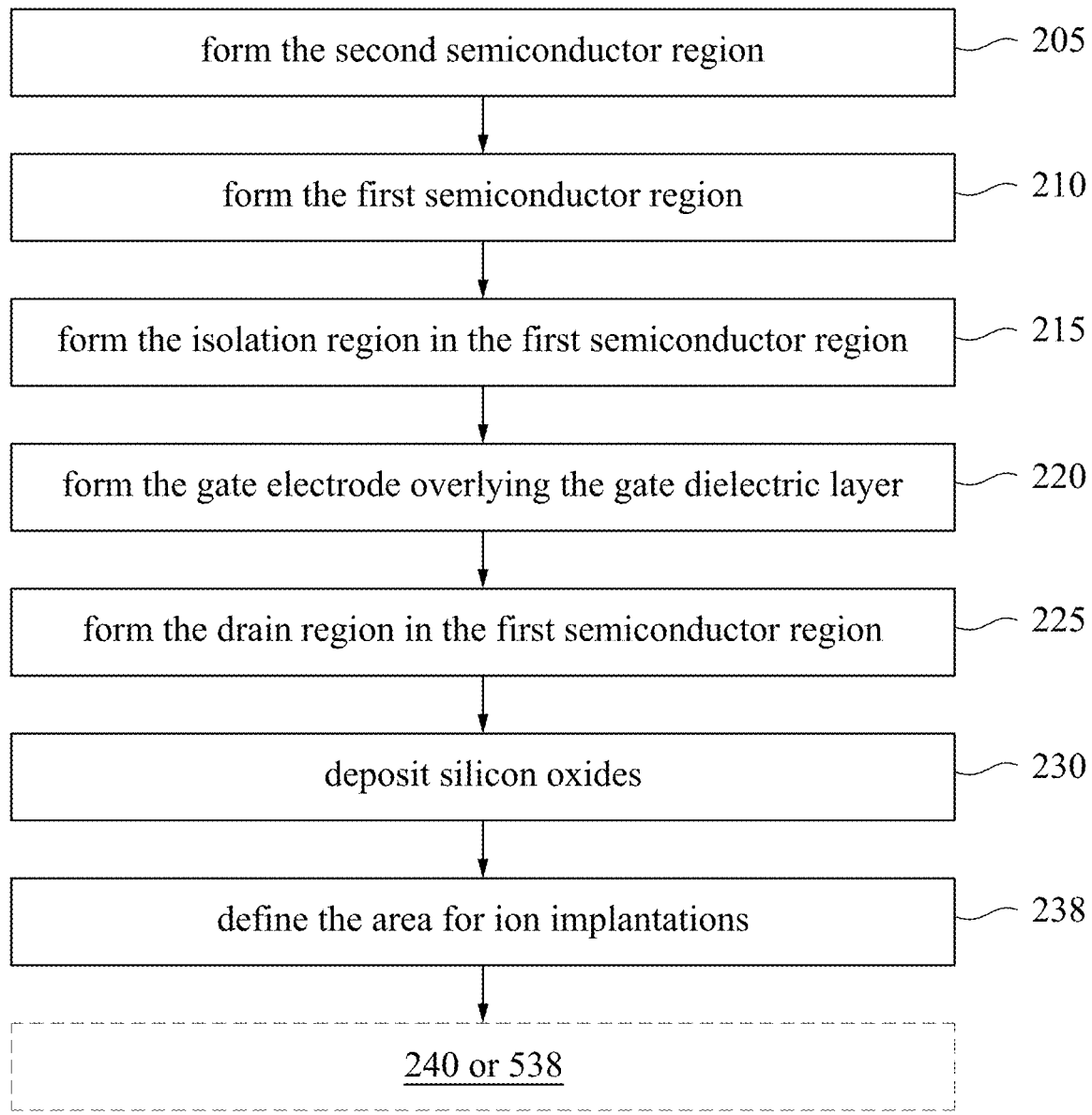
FIG. 7 is a partial flowchart of a modification of the method of FIG. 2 or the method of FIG. 5, in accordance with some embodiments.
Figure 8A:
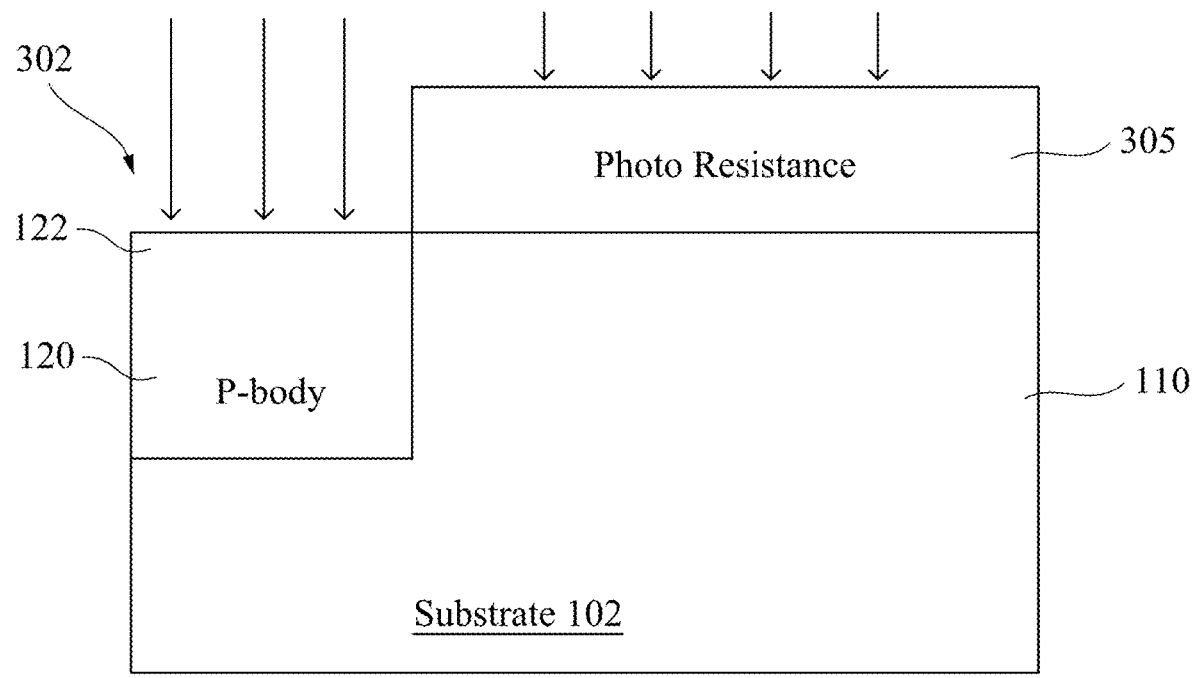
FIGS. 8A-8B are cross-sectional views of the device structures at some early stages, in accordance with some embodiments.
Figure 8B:
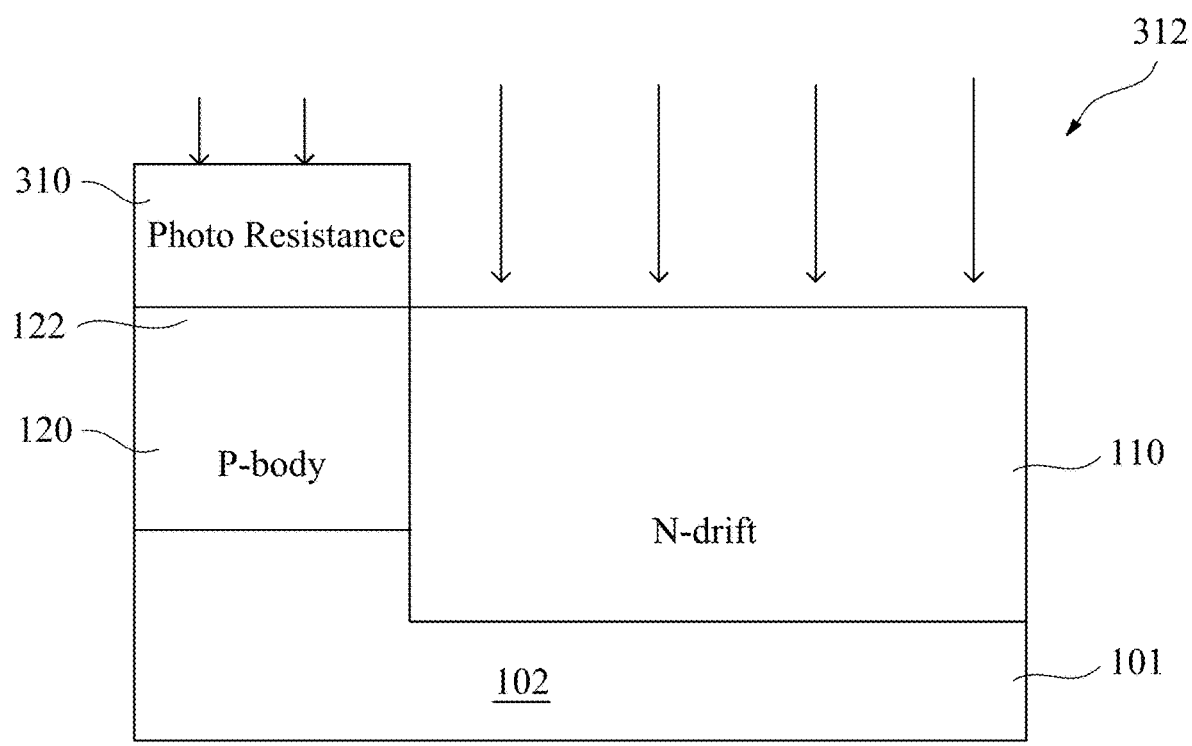
Figure 9A:
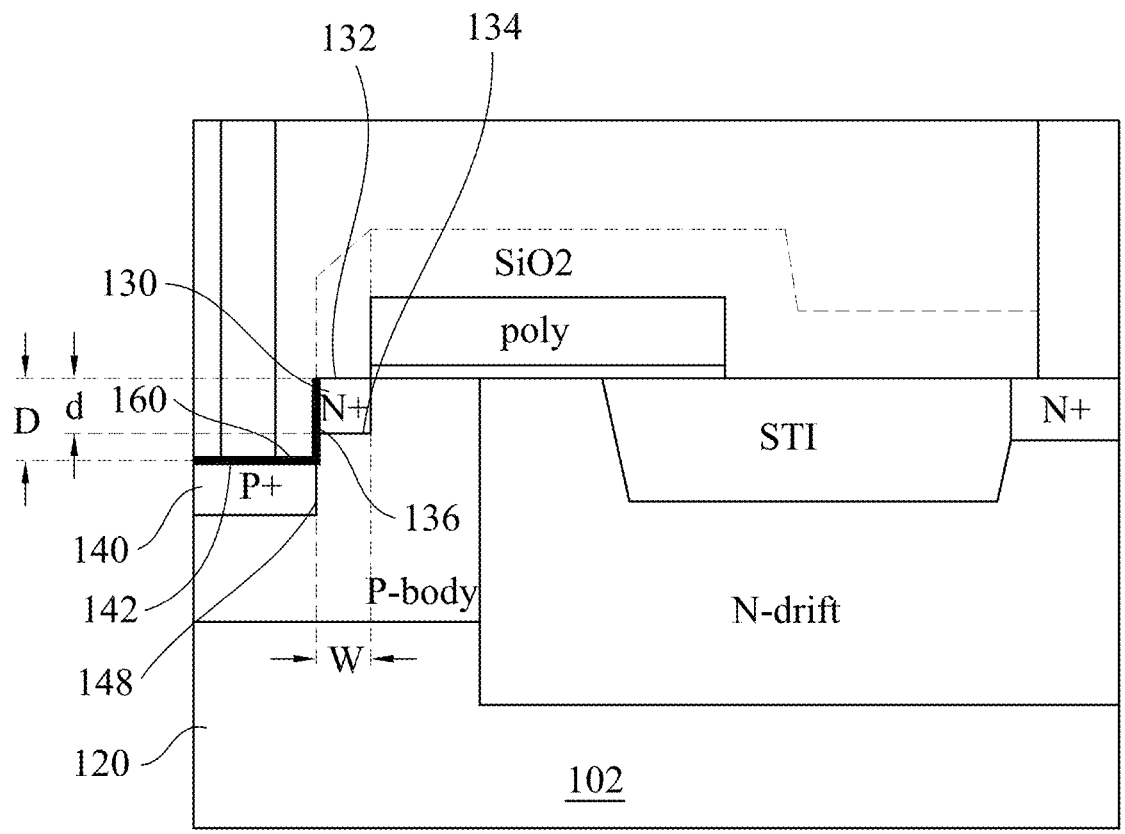
FIGS. 9A-9C are cross-sectional views of LDMOS devices, in accordance with some embodiments.
Figure 9B:
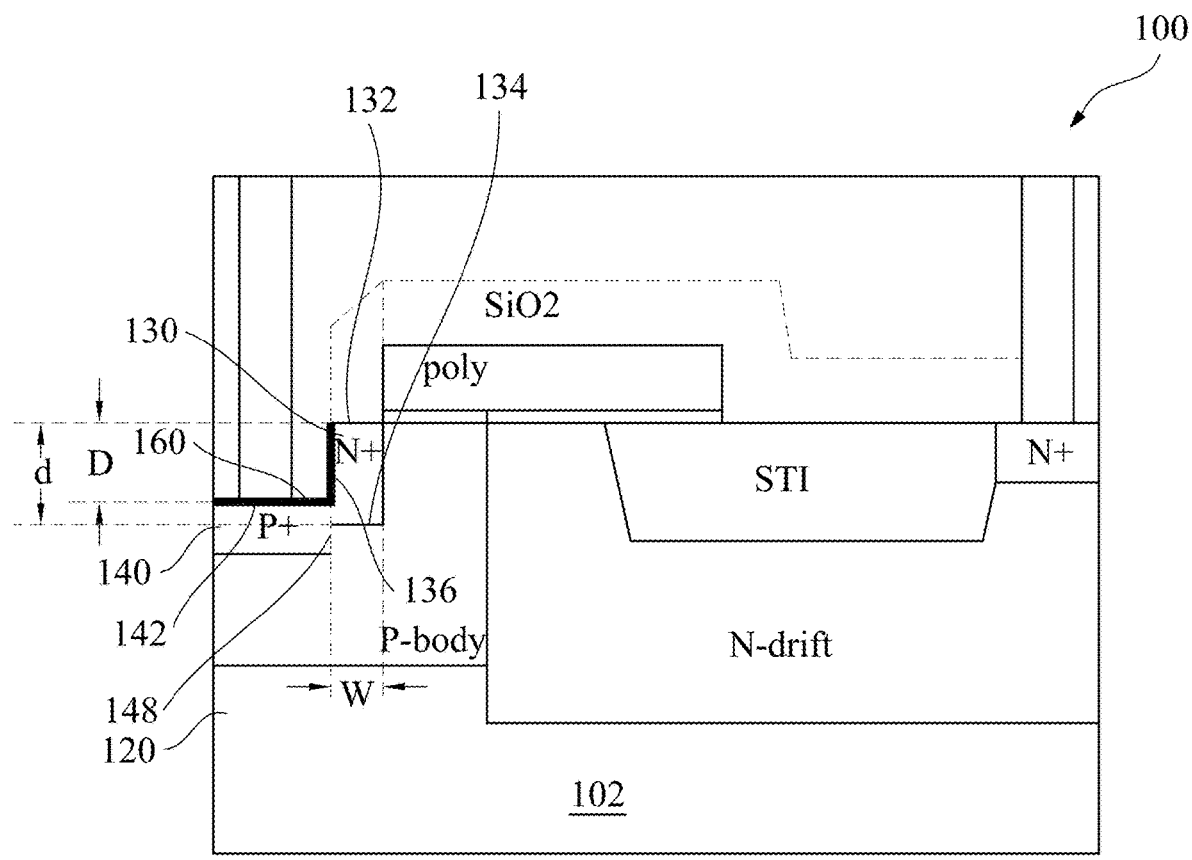
Figure 9C:
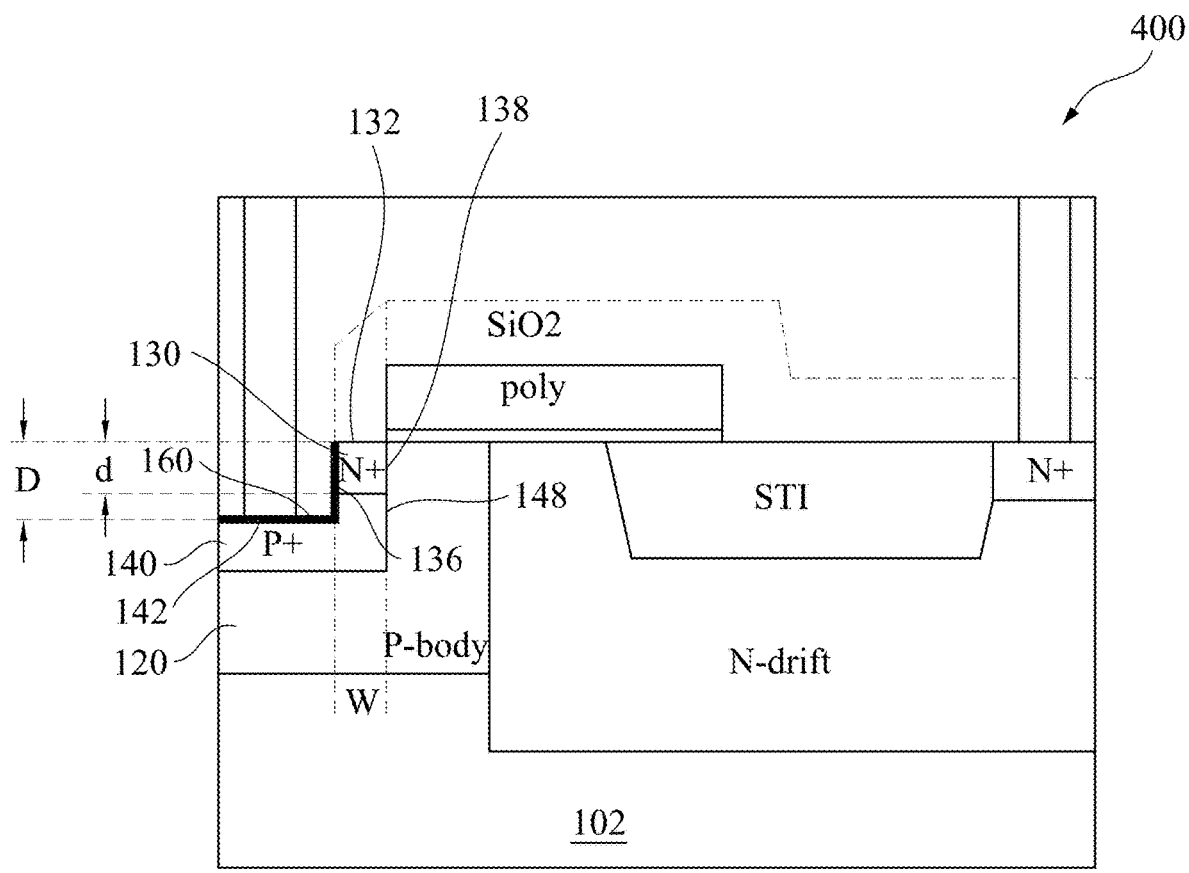

In the example LDMOS devices in FIGS. 4A-4C, a part of the p-type substrate is used as the p-type body in the second semiconductor region 120. In some alternative embodiments, as shown in FIGS. 9A-9C, the p-type body and the second semiconductor region 120 of the LDMOS devices are formed in a p-type well created by implanting ions into an intrinsic substrate or a lightly doped substrate. In some embodiments, when the LDMOS devices in FIGS. 9A-9C are fabricated based on methods that are modified from the method 200 of FIG. 2 or the method 500 of FIG. 5, the p-type well is created at an operation either before or after the operation for forming the first semiconductor region. FIG. 7 is a partial flowchart of a modification of the method 200 of FIG. 2 or the method 500 of FIG. 5, in accordance with some embodiments. In FIG. 7, as an example, operation 205 for forming the second semiconductor region is carried out before operation 210 for forming the first semiconductor region. In other embodiments, operation 205 is carried out after operation 210. FIGS. 8A-8B are cross-sectional views of the device structures at early stages during the fabrication of the LDMOS devices in FIGS. 9A-9C, in accordance with some embodiments.

In FIG. 7, at operation 205, a second semiconductor region is formed. In the embodiment as shown in FIG. 8A, the second semiconductor region 120 having the p-type conductivity is formed as a p-type well on an intrinsic substrate 102. The p-type well 122 is created with ion implantations by doping the semiconductor region under the opening 302 in the layer of photoresists 305. Examples of the p-type dopants for doping the second semiconductor region 120 include boron, gallium, aluminum, indium, a combination thereof, or other suitable materials. In some embodiments, the p-type doping density in the body contact region 140 is in a range from about $10^{19}/cm^3$ to about $10^{21}/cm^3$. The doping density is chosen to be sufficiently high to form ohmic contact with additional conductive layer for connecting to the body contact region 140. After operation 205, a first semiconductor region is formed at operation 210. In the embodiments as shown in FIG. 8B, the first semiconductor region 110 having the n-type conductivity is formed on the intrinsic substrate 102. Operation 210 and additional operations that follow operations 210 have been described in more detail with respect to the method 200 of FIG. 2 and the method 500 of FIG. 5. Operation 210 and additional operations that follow operations 210 are not repeated with respect to the process flow in FIG. 7.

Figure 10:
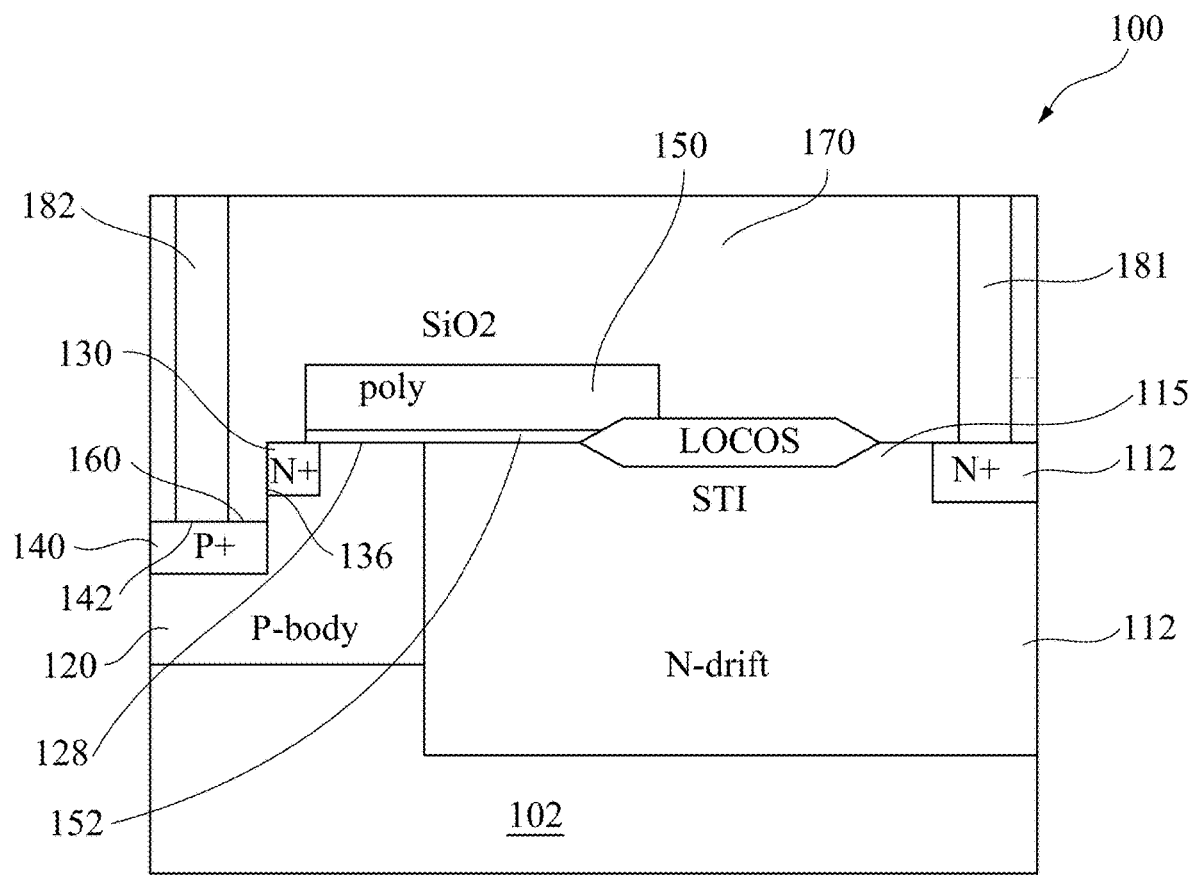
FIG. 10 is a cross-sectional view of a LDMOS device, in accordance with some embodiments.

In the example LDMOS devices in FIGS. 4A-4C and in FIGS. 9A-9C, the isolation region 115 is fabricated in the form of a Shallow Trench Isolation (STI). In alternative embodiments, the isolation region 115 in the LDMOS device of FIG. 10 is fabricated in the form of a Local Oxidation of Silicon (LOCOS) region generated by thermal oxidation.

The example LDMOS devices in FIGS. 4A-4C and in FIGS. 9A-9C, which are manufactured with the method 200 of FIG. 2 and the method 500 of FIG. 5, are n-channel MOSFETs. In alternative embodiments, the example LDMOS devices in FIGS. 11A-11C and FIGS. 12A-12C are p-channel MOSFETs.

When the method 200 of FIG. 2 or the method 500 of FIG. 5 is used to manufacture an n-channel LDMOS device (such as one of the LDMOS devices in FIGS. 4A-4C and in FIGS. 9A-9C), the first semiconductor region 110 has the n-type conductivity, and the second semiconductor region 120 has the p-type conductivity. Both the drain region 112 and the source region 130 are heavy doped n-type semiconductor regions. The body contact region 140 is a heavy doped p-type semiconductor region. In contrast, when the method 200 of FIG. 2 or the method 500 of FIG. 5 is used to manufacture a p-channel LDMOS device (such as one of the LDMOS devices in FIGS. 11A-11C and FIGS. 12A-12C), the first semiconductor region 110 has the p-type conductivity, and the second semiconductor region 120 has the n-type conductivity. Both the drain region 112 and the source region 130 are heavy doped p-type semiconductor regions. The body contact region 140 is a heavy doped n-type semiconductor region.

When the method 200 of FIG. 2 is used to manufacture the p-channel LDMOS device in FIGS. 11A-11B and FIGS. 12A-12B, at operation 215, the isolation region 115 is fabricated in the first semiconductor region 110 having the p-type conductivity. At operation 220, the gate electrode 150 overlying the gate dielectric layer 152 is fabricated. At operation 225, the drain region 112 in the first semiconductor region 110 is formed by doping p-type dopants into the region using ion implantation techniques. At operation 230, silicon oxides 330 are deposited on the device structure formed at operation 225. Then, the area for forming the source precursor region is defined with photolithography techniques at operation 235, and the source precursor region is formed with ion implantations at operation 240. Next, at operation 250, a spacer 360 is formed on a side wall of the gate electrode 150 and a side wall of the silicon oxides 330. At operation 260, a portion of the source precursor region unprotected by the spacer 360 is etched with reactive ion etching and forms the source region 130 which is self-aligned with the gate electrode 150. At operation 270, the body contact region 140 is formed by doping n-type dopants into the region using ion implantation techniques. At operation 280, the conformal conductive layer 160 is deposited over an upper surface 142 of the body contact region 140 and a side surface 136 of the source region 130. At operation 290, the second contact plug 182 is connected to the conformal conductive layer 160 and the first contact plug 181 is connected to the drain region 112. Both the second contact plug 182 and the first contact plug 181 pass through the dielectric isolation layer 170.

Figure 11A:
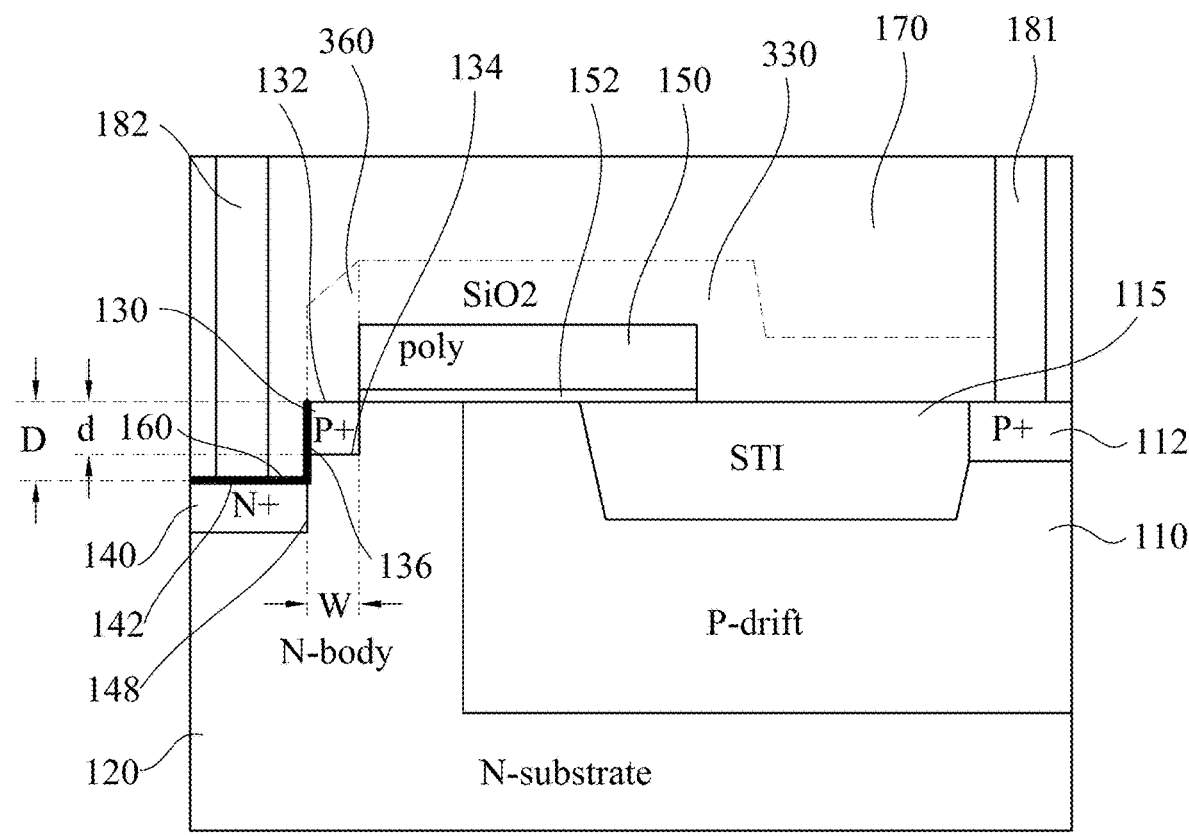
FIGS. 11A-11C and FIGS. 12A-12C are cross-sectional views of LDMOS devices, in accordance with some embodiments.
Figure 11B:
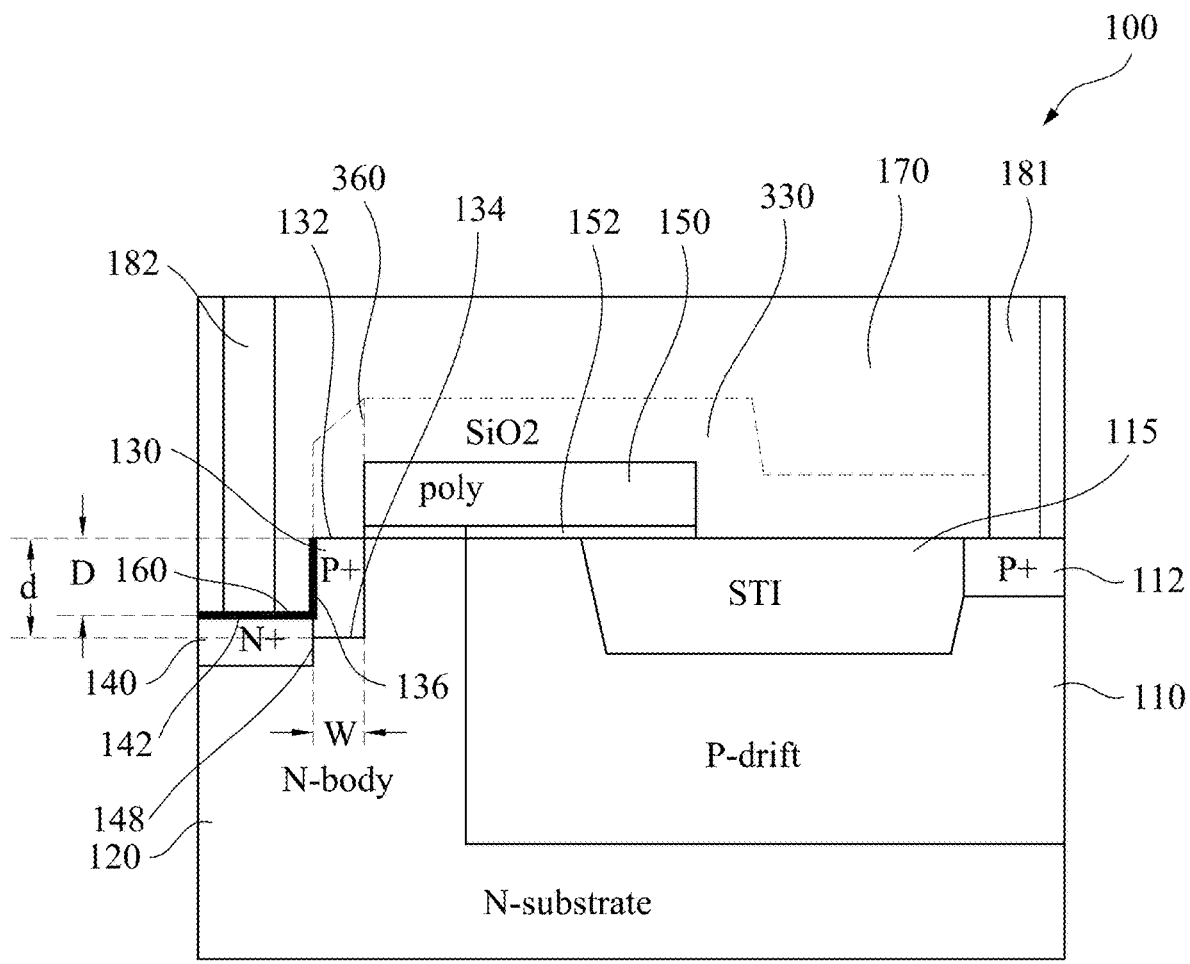
Figure 11C:
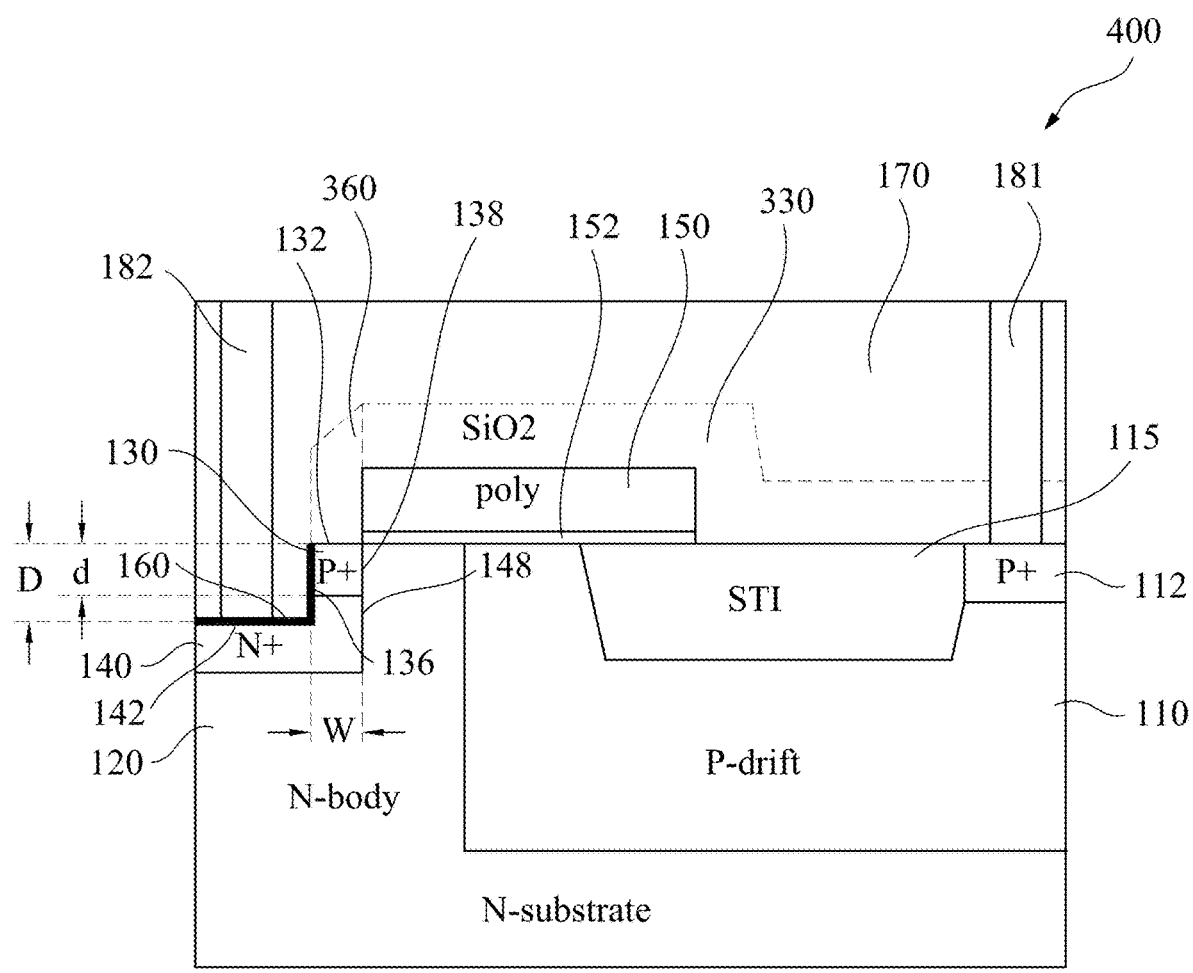
Figure 12A:
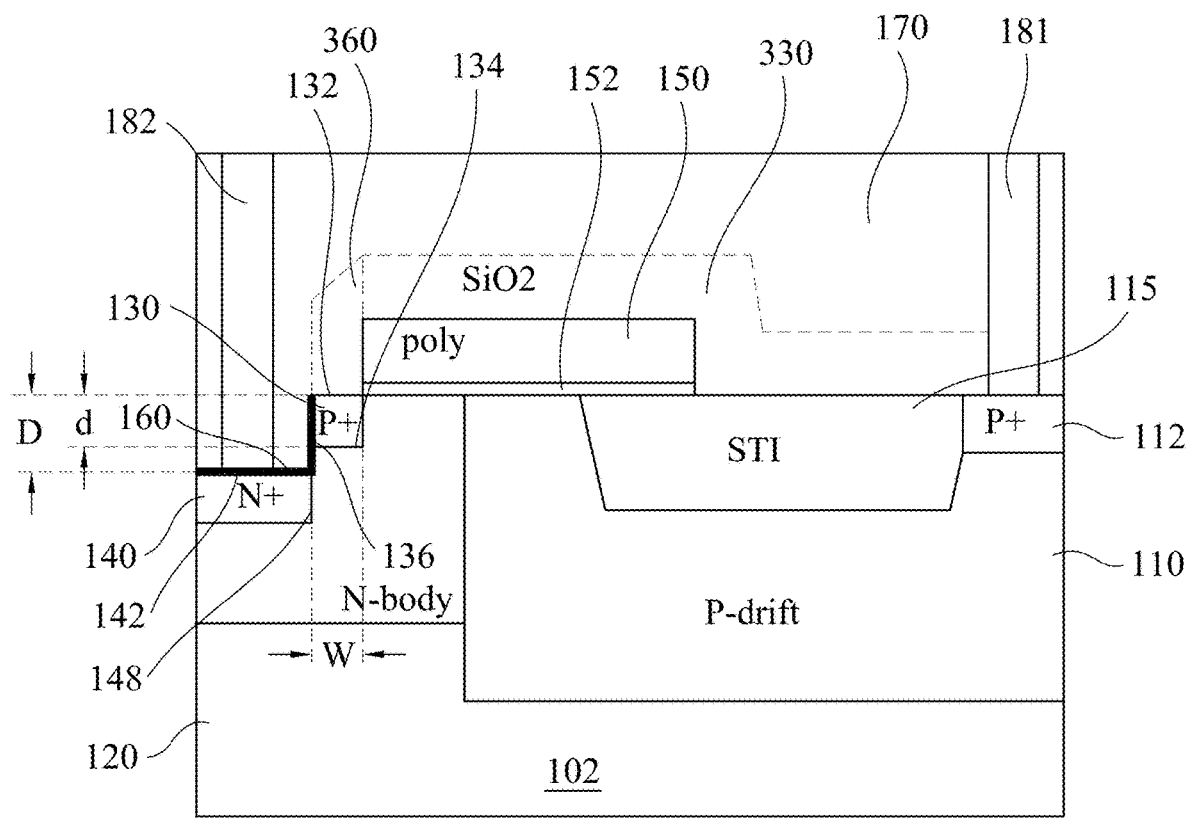
Figure 12B:
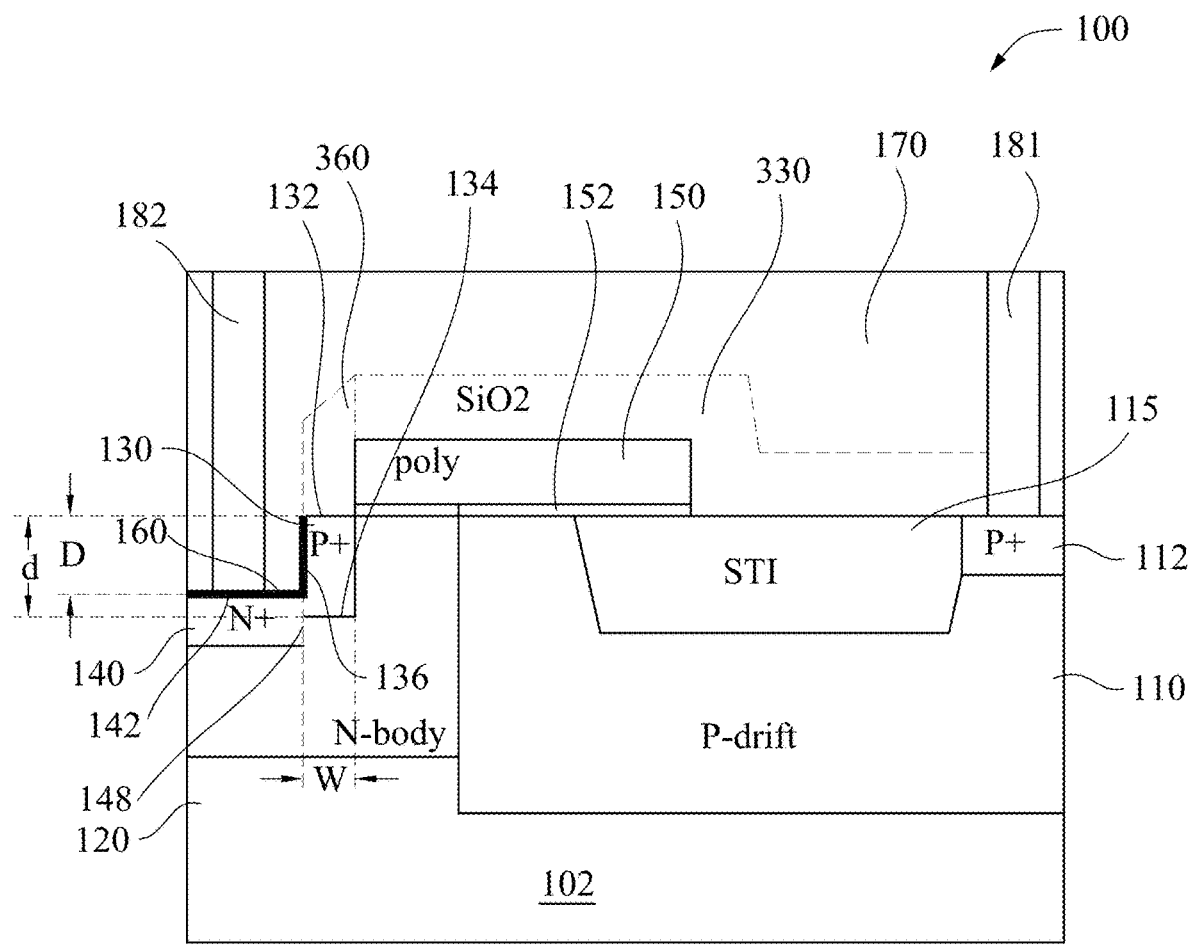
Figure 12C:
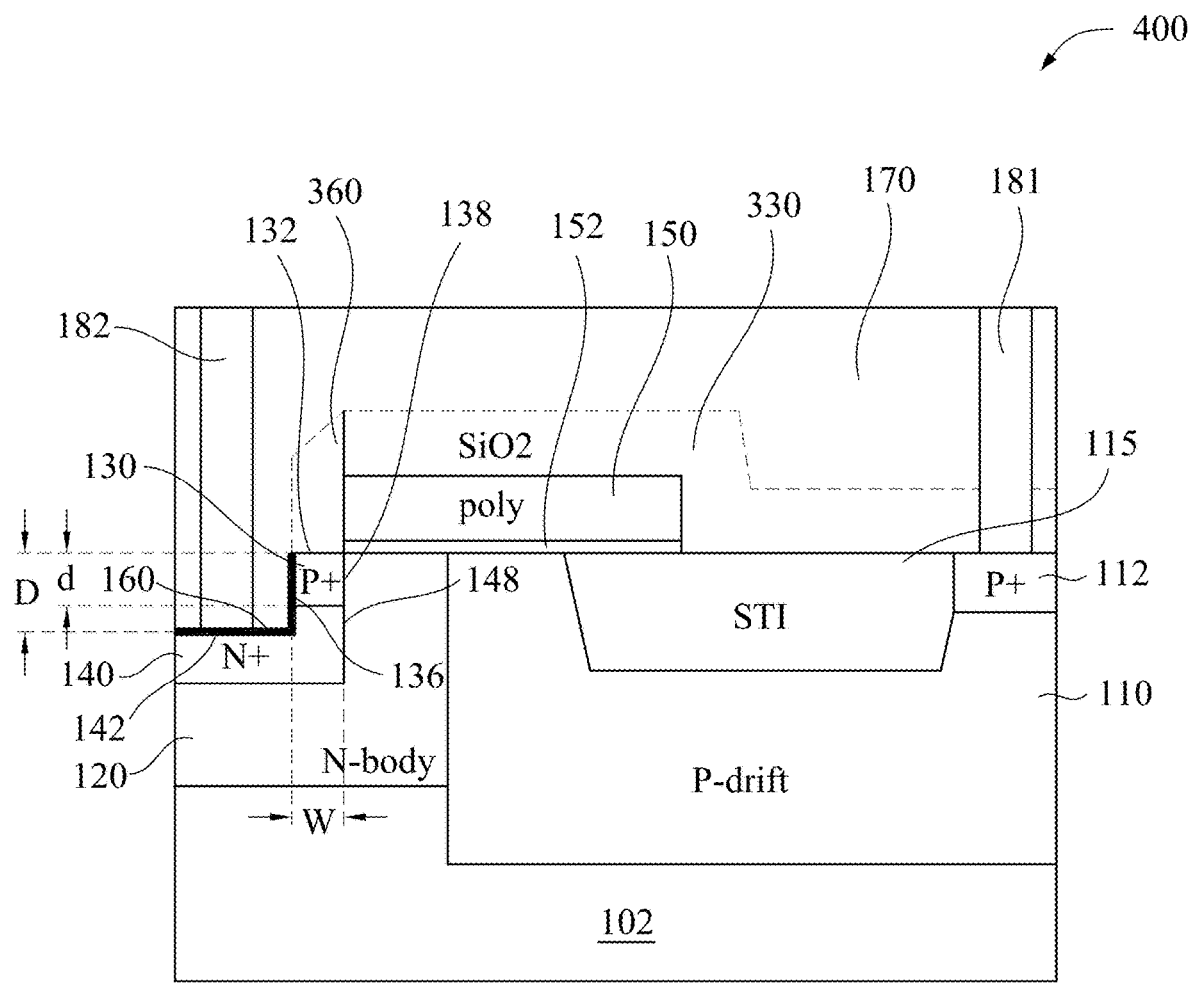

When the method 500 of FIG. 5 is used to manufacture the p-channel LDMOS device in FIG. 11C and FIG. 12C, at operation 215, the isolation region 115 is fabricated in the first semiconductor region 110 having the p-type conductivity. At operation 220, the gate electrode 150 overlying the gate dielectric layer 152 is fabricated. At operation 225, the drain region 112 in the first semiconductor region 110 is formed by doping p-type dopants into the region using ion implantation techniques. At operation 230, silicon oxides 330 are deposited on the device structure formed at operation 225. Then, the area for forming the source precursor region is defined with photolithography techniques at operation 235. Next, at operation 538, the region for forming the body contact region 140 are implanted with the p-type dopants. After the source precursor region is formed above the body contact region 140 with ion implantations at operation 540, a spacer 360 is formed at operation 550 on a side wall of the gate electrode 150 and a side wall of the silicon oxides 330. Then, at operation 560, a portion of the source precursor region above the body contact region 140 is etched with reactive ion etching, and the source region 130 is formed underneath the spacer 360. Next, at operation 280, the conformal conductive layer 160 is deposited over an upper surface 142 of the body contact region 140 and a side surface 136 of the source region 130. At operation 290, the second contact plug 182 is connected to the conformal conductive layer 160 and the first contact plug 181 is connected to the drain region 112. Both the second contact plug 182 and the first contact plug 181 pass through the dielectric isolation layer 170.

Aspects of the present disclosure relate to a semiconductor device. The semiconductor device includes a first semiconductor region having a first conductivity type, a second semiconductor region having a second conductivity type, a source region in the second semiconductor region, and a body contact region in the second semiconductor region. The semiconductor device also includes a channel region, in the second semiconductor region, located laterally between the source region and the first semiconductor region, a gate dielectric layer overlying both the channel region and a portion of the first semiconductor region, and a gate electrode overlying the gate dielectric layer. The semiconductor device further includes a conformal conductive layer covering an upper surface of the body contact region and a side surface of the source region.

Another aspect of the present disclosure relate to a method of forming a semiconductor device. The method includes forming a gate electrode overlying a gate dielectric layer covering both a channel region in a second semiconductor region and a portion of a first semiconductor region. The first semiconductor region has a first conductivity type and the second semiconductor region has a second conductivity type. The method also includes implanting first-type dopants into an exposed portion of the second semiconductor region masked by a hard mask to form a source precursor region in the second semiconductor region. The method also includes forming a spacer overlying the source precursor region and having a first side laterally adjacent to the gate electrode. The method also includes recessing a surface region in the source precursor region by an etching process masked at least by the spacer and forming a source region. The method also includes implanting second-type dopants through the surface region masked at least by the spacer to form a body contact region. The method further includes forming a conformal conductive layer covering an upper surface of the body contact region and a side surface of the source region.

Still another aspect of the present disclosure relate to a method of forming a semiconductor device. The method includes forming a gate electrode overlying a gate dielectric layer covering both a channel region in a second semiconductor region and a portion of a first semiconductor region. The first semiconductor region has a first conductivity type and the second semiconductor region has a second conductivity type. The method also includes forming a hard mask providing an exposed portion of the second semiconductor region. The method also includes doping the exposed portion of the second semiconductor region by a first ion implantation process masked by the hard mask and forming a body contact region. The method also includes doping the exposed portion of the second semiconductor region by a second ion implantation process masked by the hard mask and forming a source precursor region overlying the body contact region. The method also includes forming a spacer overlying the source precursor region and having a first side laterally adjacent to the gate electrode. The method also includes removing a part of the source precursor region by an etching process masked at least by the spacer, to form a source region while exposing an upper surface of the body contact region. The method further includes forming a conformal conductive layer covering the upper surface of the body contact region and a side surface of the source region.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
   a first semiconductor region having a first conductivity type;
   a second semiconductor region having a second conductivity type;
   a source region having the first conductivity type in the second semiconductor region;
   a channel region, in the second semiconductor region, located laterally between the source region and the first semiconductor region;
   a gate dielectric layer overlying both the channel region and a portion of the first semiconductor region;
   a gate electrode overlying the gate dielectric layer;
   a body contact region in the second semiconductor region;
   a spacer, overlying the source region, having a first side laterally adjacent to the gate electrode, wherein the first side of the spacer is vertically aligned with a first side surface of the source region, and wherein the first side surface is an interface that separates the source region having the first conductivity type from the second semiconductor region having the second conductivity type; and
   a conformal conductive layer covering an upper surface of the body contact region and a second side surface of the source region.

2. The semiconductor device of claim 1, further comprising:
   a contact plug connecting to the conformal conductive layer through a dielectric isolation layer.

3. The semiconductor device of claim 1, wherein the conformal conductive layer is a layer of metal silicide.

4. The semiconductor device of claim 1, further comprising:
   a drain region in the first semiconductor region.

5. The semiconductor device of claim 4, further comprising:
   an isolation region, in the first semiconductor region, located laterally between the drain region and the second semiconductor region.

6. The semiconductor device of claim 1, wherein the spacer has a second side vertically aligned with the second side surface of the source region.

7. The semiconductor device of claim 1, wherein the body contact region has a first side vertically aligned with the second side surface of the source region.

8. The semiconductor device of claim 7, wherein the upper surface of the body contact region is recessed from a top surface of the source region with a depth that is less than a distance between the top surface of the source region and a bottom surface of the source region.

9. The semiconductor device of claim 1, wherein the source region overlies the body contact region.

10. The semiconductor device of claim 9, wherein the upper surface of the body contact region is recessed from a top surface of the source region with a depth that is larger than or equal to a distance between the top surface of the source region and a bottom surface of the source region.

11. The semiconductor device of claim 9, wherein the body contact region has a first side vertically aligned with a side of the gate electrode.

12. A semiconductor device comprising:
    a first semiconductor region having a first conductivity type;
    a second semiconductor region having a second conductivity type;
    a source region having the first conductivity type in the second semiconductor region;
    a channel region, in the second semiconductor region, located laterally between the source region and the first semiconductor region;
    a gate dielectric layer overlying both the channel region and a portion of the first semiconductor region;

a gate electrode overlying the gate dielectric layer;
a body contact region in the second semiconductor region; and
a spacer, overlying the source region, having a first side laterally in direct contact with the gate electrode and vertically aligned with a first side surface of the source region, wherein the first side surface is an interface that separates the source region having the first conductivity type from the second semiconductor region having the second conductivity type, and wherein the spacer has a second side vertically aligned with a second side surface of the source region.

13. The semiconductor device of claim 12, further comprising:
a drain region in the first semiconductor region; and
an isolation region, in the first semiconductor region, located laterally between the drain region and the second semiconductor region.

14. The semiconductor device of claim 13, further comprising:
a conformal conductive layer covering an upper surface of the body contact region and the second side surface of the source region.

15. The semiconductor device of claim 12, wherein the body contact region is in direct contact with the source region.

16. A semiconductor device comprising:
a first semiconductor region having a first conductivity type;
a second semiconductor region having a second conductivity type;
a source region having the first conductivity type in the second semiconductor region;
a channel region, in the second semiconductor region, located laterally between the source region and the first semiconductor region;
a drain region in the first semiconductor region;
an isolation region in the first semiconductor region and located laterally between the drain region and the second semiconductor region;
a gate electrode atop of both the channel region and a portion of the first semiconductor region;
a body contact region in the second semiconductor region; and
a spacer, overlying the source region, having a first side laterally in direct contact with the gate electrode and vertically aligned with a first side surface of the source region, wherein the first side surface is an interface that separates the source region having the first conductivity type from the second semiconductor region having the second conductivity type and wherein the spacer has a second side vertically aligned with a second side surface of the source region.

17. The semiconductor device of claim 16, wherein the isolation region is a shallow trench isolation in the first semiconductor region.

18. The semiconductor device of claim 16, wherein the isolation region is a local oxidation of silicon region in the first semiconductor region.

19. The semiconductor device of claim 16, wherein the body contact region is in direct contact with the source region.

20. The semiconductor device of claim 19, further comprising:
a conformal conductive layer covering an upper surface of the body contact region and the second side surface of the source region.

* * * * *